(12) United States Patent
Mehrotra et al.

(10) Patent No.: US 12,288,630 B2
(45) Date of Patent: Apr. 29, 2025

(54) APPARATUS, SYSTEM AND METHOD ADAPTED TO ENABLE AUTOMATED WIRE OR CABLE CODE READING AND MANUFACTURE OF WIRE HARNESSES AND CABLE ASSEMBLIES

(71) Applicant: Materials Technology Corporation, Monroe, CT (US)

(72) Inventors: Yogesh Mehrotra, Monroe, CT (US); Paul Glenn, Wellesley, MA (US)

(73) Assignee: Materials Technology Corporation, Monroe, CT (US)

( * ) Notice: Subject to any disclaimer, the term of this patent is extended or adjusted under 35 U.S.C. 154(b) by 0 days.

(21) Appl. No.: 18/951,219

(22) Filed: Nov. 18, 2024

(65) Prior Publication Data
US 2025/0079048 A1 Mar. 6, 2025

Related U.S. Application Data

(63) Continuation of application No. 18/071,614, filed on Nov. 29, 2022, now Pat. No. 12,176,124, which is a
(Continued)

(51) Int. Cl.
*H01B 13/012* (2006.01)
*G05B 19/042* (2006.01)
(Continued)

(52) U.S. Cl.
CPC ..... *H01B 13/01236* (2013.01); *G05B 19/042* (2013.01); *G06F 30/00* (2020.01); *H01B 13/01209* (2013.01); *G05B 2219/31027* (2013.01); *H01R 43/20* (2013.01); *H01R 43/28* (2013.01)

(58) Field of Classification Search
CPC ........ H01B 13/01236; H01B 13/01209; G05B 19/042; G05B 2219/31027; G06F 30/00; H01R 43/20; H01R 43/28
See application file for complete search history.

(56) References Cited

U.S. PATENT DOCUMENTS 4,677,734 A * 7/1987 Bloch .................... B65H 51/20
29/564.6
9,721,702 B1 * 8/2017 Guglielmo ............. H01R 43/28
(Continued)

*Primary Examiner* — Michael C Zarroli
(74) *Attorney, Agent, or Firm* — Vela Wood Staley Young; Steven Wood

(57) ABSTRACT

The device, system and process of the present invention greatly reduces the time and space necessary to assemble a wire harness enables efficient manufacture of wire harnesses and cable assemblies. The present invention comprises at least a wire or cable viewer module, a machine vision and optical character recognition module, one or more receptacles designed to receive and hold in place a wire harness or cable assembly connector, having multiple pin-hole cavities illuminated by a light source to identify a cavity for wire or cable insertion. Moreover, the present invention may further comprise a portable, computer-implemented system capable of executing a series of automated process steps designed to identify wire and cable markings and guide the error-free insertion of identified wires and cables into wire harness connector pin-hole receptacles for assembly of a wire harness or cable assembly.

20 Claims, 17 Drawing Sheets

Related U.S. Application Data continuation of application No. 17/153,821, filed on Jan. 20, 2021, now Pat. No. 11,569,010, which is a continuation of application No. 16/223,063, filed on Dec. 17, 2018, now Pat. No. 10,964,455.

(51) Int. Cl.
*G06F 30/00* (2020.01)
*H01R 43/20* (2006.01)
*H01R 43/28* (2006.01)

(56) References Cited

U.S. PATENT DOCUMENTS

| | | | | |
|---|---|---|---|---|
| 2005/0147819 A1* | 7/2005 | Kelley | ................ | H01R 9/2475 428/402 |
| 2005/0235491 A1* | 10/2005 | Macnutt | ............... | H01R 9/2475 29/857 |

* cited by examiner

APPARATUS, SYSTEM AND METHOD ADAPTED TO ENABLE AUTOMATED WIRE OR CABLE CODE READING AND MANUFACTURE OF WIRE HARNESSES AND CABLE ASSEMBLIES

CROSS REFERENCE TO RELATED APPLICATION

This application is a non-provisional of and claims the benefit under 35 U.S.C. § 120 of the earlier filing date of U.S. Nonprovisional application Ser. No. 18/071,614, filed on Nov. 29, 2022, which itself claims priority to U.S. Nonprovisional application Ser. No. 17/153,821, filed on Jan. 20, 2021, which itself claims priority to U.S. Nonprovisional application Ser. No. 16/223,063, filed on Dec. 17, 2018, which are each hereby incorporated in entirety by reference.

BACKGROUND

1. Field

The present invention relates to the efficient manufacture of wire harnesses and cable assemblies. Specifically, the present invention greatly reduces the amount of physical space and length of time required to assemble a wire harness. More specifically, in a preferred embodiment, the apparatus of the present invention may be a portable, computer-implemented system capable of executing a series of automated process steps designed to identify wire markings and guide the error-free insertion of identified wires into a connector for assembly of a wire harness.

2. Description of Related Art

Wire harnesses and cable assemblies continue to be manufactured primarily by hand, in part due to the great number of different processing steps involved and the complexity of the tasks required, which make automation of these processes and tasks a challenging proposition. The wire harness manufacturing process essentially comprises identifying and inserting wires into the designated specific pin-holes of a wire harness connector. Consider, for instance, the Amphenol MIL-DTL-38999 connector, which has 128 sockets or pin-hole receptacles, alternatively referred to herein as pin-hole cavities, in a space less than 2 inches in diameter. Inserting 128 wires, pins or stoppers/seals into their matching pin-hole cavities without any opens, shorts or mis-wires (i.e., insertions in an incorrect pin-hole) takes considerable skill and time. The task has become even more difficult and susceptible to more mis-insertions with the increasing use of thinner wires such as 26AWG and dense connectors such as Amphenol 2M805 connectors which are about 16% smaller than the corresponding standard connectors.

The conventional methods for performing the hand-assembly of wire harnesses typically require a specialized work bench and instrumentation or often a special wiring routing map layout on up to 25-foot wide form boards placed horizontal or at an incline. Several technological solutions exist to aide in the process of harness connector assembly. Using magnifiers, lamps, lasers, optical fibers and real-time video, these technologies aide in guiding assemblers step-by-step through the wire harness assembly process, with the aim to achieve insertion of wires into the correct pin-hole receptacles in their first attempt and thereby to avoid mis-wiring and consequent unnecessary and time-consuming rework to correct the insertion errors.

CAMI Research developed the Light Director® system (U.S. Pat. Nos. 4,988,980 and 5,280,251), which uses a custom-built pack of optical fibers and LED lamps to individually illuminate target pin-holes in the connector being populated with wires. A required accessory for the company's CableEye® PC-based cable-test system, customers must also purchase a mounting kit from CAMI for each mating connector that contains a CableEye plug-in board with LED sockets that attach to the tester, optical fibers, fiber guide boards, a connector support board and a hardware kit in order to create a customized assembly aid for each connector.

Customers must then put together all of these parts in the correct configuration for the specific connector that is being assembled. And, although some of the parts may be reusable, assembly of the Light Director system requires a lot of upfront labor and integration time (and thus, cost) just to complete the preliminary set up required for each connector, making the harness assembly a slow and expensive manufacturing process.

The connector being assembled (i.e., being populated with wire terminations) is attached to a mating connector in which all pin-hole positions have been fitted with individual optical fibers. Before a wire can be inserted, its code must be manually read and typed into the computer by the assembler. The Light Director then announces the corresponding pin number in English or Spanish. The corresponding optical fiber is illuminated, causing a bright, flashing light to project from inside the correct target pin-hole, assuming the customer has correctly wired the optical fibers between the mating connector and the LED sockets. However, a customized mating connector must be constructed for each connector being populated, an expensive additional cost. Moreover, it is noted that the commercial aviation industry alone uses tens of thousands of connectors, thus making Light Director system an expensive proposition.

The Light Director system confirms insertion in the correct pin-hole by blocking of the bottom-projected light from that pin-hole location into which a wire has been inserted; whereas, in contrast, insertion into an incorrect location leaves the flashing light visible. In addition, if the other end of the wire is available to be connected to the CableEye system, electronic testing software can confirm correct placement of the wire in the connector through the creation of an electrical circuit, only if the wire is inserted into the designated pin-hole cavity.

Another device, patented by Boeing, and commercialized in collaboration with Chad Industries Inc., the Harness-Mate® has two key components: a programmable pointer and a universal connector chuck. The pointer moves a laser dot over a 4 inch by 4 inch (16 square inch) working area above the connector to point top-down at the correct pin-hole to guide insertion of wires, pins or seal plugs. The universal chuck accurately positions and grips any square, rectangular or circularly shaped connectors from ⅝ inch to 3 inches in dimension.

This system also features a user-programmable database to store information on customer desired connector assemblies. The software also provides a visual representation of the connector and controls the laser pointer that indicates where plugs, pins or wires should be inserted. After selecting a connector assembly from the database, the assembler secures the proper connector in the chuck. Next, wire marking label information for the wire must be entered into the computer via bar code, optical character recognition or direct keyboard input.

In response, the software references the corresponding database and directs a laser dot from above at the specific cavity where the wire is to be inserted. The assembler performs the insertion, and the process repeats for each wire. The HarnessMate provides the flexibility to assemble entire harnesses but does not provide electronic verification of correct wire insertion. Also, the highlighting of specific pin cavities rapidly becomes progressively more difficult as the number of wires inserted into the connector increases because the inserted wires, like wet spaghetti strands, spill over and crowd the face of the connector, thus preventing the user from clearly observing the laser dot lighting within the specified pin cavity.

Another system that provides guided connector assembly is the Cirris Systems Corp. Pin-Sight, which is compatible with circular, square or rectangle connectors up to 3.5 inches by 3.5 inches. An adapter for larger connectors lets assemblers expand the working area horizontally. No mating connectors or wired mating interface, such as the CAMI CableEye, are required, resulting in shorter setup and changeover times. The computer-based product comes with a CCD camera, mounting vice, force and sense gauge, and software. A barcode scanner and mini keyboard are optional, for manual input of wire IDs.

After turning on the Pin-Sight computer, the assembler locks the connector into place and aligns it using two target pin-hole cavities, as specified by the software. The camera then takes a digital picture of the connector and displays a close-up image of it on the computer monitor. Depending on the application, seal plugs might need to be inserted prior to wire insertion. If pins are also required, plugs and pins are programmed in groups.

On the connector close-up displayed on the computer monitor, target circles are shown around each pin-hole cavity that is to receive a wire or a stopper. Before a wire can be inserted, the assembler must enter the wire's marking label information into the computer by typing it on a keyboard, speaking it into a microphone, or scanning a bar code. Pin-Sight then announces the wire color and pin-hole location, and provides, in the upper-right-hand corner of the computer screen, a close-up of the specific cavity where the wire should be inserted.

The assembler locates the pin-hole, using the visual aid, inserts the wire and pulls back on it with enough force to ensure it is locked in. An on-screen gauge indicates the amount of force. When the contact retention is correct, Pin-Sight makes a "ding" sound. The assembler repeats the process for each wire until a tone is heard, indicating the connector is full. To enhance accuracy, a video feed shows each plug, pin and wire being inserted in real time-even when the connector is nearly filled. By showing the video over the connector image, Pin-Sight creates a ghosting effect that lets the assembler "see through" his hand and also the inserted plugs and wires. However, the jumble of visual imagery can make it difficult to discern exactly what the user is seeing. In addition, as of 2016 Cirris discontinued the Pin-Sight product due to lack of user and market acceptance.

One of the biggest problems in harness building is mis-wiring individual wires in the connector pin locations, which necessitates considerable rework and additional cost. None of the systems or devices included in the prior art discussed above entirely eliminates the problem of mis-wiring. Thus, it is desirable to have an improved system and process that is faster, more efficient and accurate, and capable of further eliminating unnecessary rework and additional costs associated with mis-wiring.

SUMMARY OF THE INVENTION

The following is a summary of the invention in order to provide a basic understanding of some aspects of the invention. This summary is not intended to identify all key or critical elements of the invention or to delineate the entire scope of the invention. Its sole purpose is to present some concepts of the invention in a simplified form as a prelude to the more detailed description that is presented later.

Reference throughout this specification to "one embodiment" or "an embodiment" means that a particular feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

This present invention relates to a system and process for building wire harnesses or cable assemblies. Specifically, the system facilitates assembly of a wire harness, including insertion of wires or wire tips into corresponding connector pin-hole receptacles. Further, the system comprises 1) a computer, including computer memories, computer processors, displays, and data inputs and data outputs, 2) a wire marking reader connected to the computer data inputs and data outputs, which detects colors and pattern markings on a wire covering such as insulation or sleeve, etc., creates and sends a data set describing the colors and patterns detected to the computer data input, and wherein the computer identifies wires based on the colors and the pattern markings detected on the wire covering, 3) a cassette tray equipped with harness connector receptacles configured to hold a harness connector plug or socket, 4) means to hold harness connectors in place within the harness connector receptacles of the cassette tray, 5) a two-axis translation stage (i.e., a gantry) connected to the computer data inputs and data outputs, wherein the translation stage is located below the harness connector cassette tray in the sub-surface compartment, and it sends data sets indicating past, present or future translation stage location to the computer data input, 6) at least one light source mounted on the carriage of the two-axis translation stage, wherein the computer controls the translation stage and precisely positions it and the light source(s) beneath exact pin-hole receptacles of the connector corresponding to identified wires, and wherein the computer switches the light sources on and off to illuminate the pin-hole receptacles from below as an indication of and guide to where to insert the wire or wire tip.

In a preferred embodiment, the system is contained within a carrying case. In a further preferred embodiment, the case or container includes a top cover that holds a computer or tablet computer display screen and wherein the case or container also includes a cassette tray holder that holds multiple cassette trays. The system may further include a harness connector clamp configured to lock a harness connector in place within a harness connector receptacle of the cassette tray. In alternative preferred embodiments, the cassette tray platform, a cassette tray and the two-axis translation stage (i.e., gantry) may be integrated into a separate, independent module, which we refer to herein as an "insertion stage" for easy reference, that is connected to the other unbundled components of the present invention.

The process of the present invention facilitates assembly of a wire harness, including insertion of wires or wire tips into appropriate harness connector pin-hole receptacles, implemented by a computer-enabled system. This process comprises the steps of storing and maintaining a database on a non-transitory computer readable medium connected to a computer, wherein the information contained in the database includes wire harness IDs, harness connector IDs, cassette tray IDs, wire IDs, colors and pattern wire marking identifiers included on wire coverings, pin-hole receptacle IDs, pin-hole receptacle XY coordinates, pin-hole wire connections, user credentials and wire harness job tables.

The non-transitory computer readable medium also contains a set of process instructions that, when executed by the processor, cause the system to implement, at a minimum, the following steps: 1) prompting a user to log in to the system, using the user credentials, 2) prompting the user to enter a wire harness ID for a wire harness the user needs to build, 3) registering the entered wire harness ID, 4) establishing a wire harness job table including the set of discrete tasks required to complete the wire harness, 5) identifying a harness connector ID corresponding to the selected wire harness ID, wherein the harness connector has (n) number of pin-hole receptacles, 6) identifying a cassette tray ID, equipped with one or more harness connector receptacle cavities, each harness connector receptacle configured to hold a harness connector (plug or socket), corresponding to the selected wire harness ID, 7) prompting the user to retrieve the identified cassette tray, to place the cassette tray in a cassette tray platform located above a two-axis translation stage, to retrieve the identified harness connector and to place the harness connector in the appropriate harness connector receptacle of the cassette tray, 8) identifying a set of (x) number of wire IDs corresponding to (x) number of wires included in the wire harness and loading into the wire harness job table at least the set of wire IDs, a set of wire marking identifiers including one or more of color and pattern markings, a set of pin-hole receptacle IDs and a set of pin-hole receptacle XY coordinates corresponding to the entered wire harness ID, and 9) iterating the following instruction set until all wires have been correctly inserted into their respective pin-hole receptacles (cavities) in the harness connector: 10) prompting the user to insert a wire into a wire marking reader, having data input and data output connections to the computer, 11) detecting by the wire marking reader, one or more of a color and a pattern marking included on a wire covering inserted into the wire marking reader, 12) sending from the wire marking reader to one or more computer data inputs a data set describing the one or more colors and markings/patterns detected, 13) determining a wire ID, based on one or more of the color and pattern markings detected, 14) determining the pin-hole receptacle cavity ID and the set of XY coordinates for the pin-hole receptacle ID corresponding to the wire ID for the wire that will be inserted into the respective pin-hole receptacle, 15) moving the translation stage from the present position to a position corresponding to the XY coordinates for the respective pin-hole receptacle, 16) switching on one or more light sources mounted on the translation stage, wherein the one or more light sources are configured to illuminate from below the respective pin-hole receptacle, 17) prompting the user to insert the wire into the respective illuminated pin-hole receptacle, 18) marking the task of inserting the wire into its respective pin-hole receptacle as completed in the wire harness job table, 19) confirming whether there are any remaining wire IDs corresponding to pin-hole receptacles that still need to have a wire inserted and, if so, 20) prompting the user to insert another wire into the wire marking reader and continuing to iterate this set of instructions and, if not, 21) marking the wire harness job as completed in the wire harness job table.

The database may further include pin-hole receptacle IDs for blocked pin-hole connections, and the process may further include the steps of: 22) iterating the following instruction set until all stoppers have been correctly inserted into their respective blocked pin-hole receptacles in the harness connector: 23) identifying one or more pin-hole receptacle IDs corresponding to up to (n-x) number of blocked pin-hole receptacles determined by the selected wire harness ID, where 'n' is the number of pin-hole cavities included in the connector and 'x' is the number of wires required for the selected harness connector, 24) determining the pin-hole receptacle ID and a corresponding set of XY coordinates for the pin-hole receptacle ID for a blocked pin-hole receptacle, 25) moving the translation stage from the present position to a position corresponding to the XY coordinates for the respective blocked pin-hole receptacle, 26) switching on one or more light sources mounted on the translation stage, wherein the one or more light sources are configured to illuminate from below the respective pin-hole receptacle to be blocked, 27) prompting the user to insert stopper into the respective illuminated pin-hole receptacle, 28) marking the task of inserting the stopper into its respective pin-hole receptacle as completed in the wire harness job table, 29) confirming whether there are any remaining pin-hole receptacle IDs corresponding to pin-hole receptacles that still need to have a stopper inserted and, if so, continuing to iterate this set of instructions and, if not, marking the task of blocking the blocked pin-hole receptacles as completed in the wire harness job table.

In a preferred embodiment, the process may further include the step of prompting the user to confirm that they have placed the identified cassette tray in the cassette tray platform and the identified harness connector in the appropriate harness connector receptacle of the cassette tray. The process may also further include the steps of confirming whether the wire ID of the wire inserted into the wire marking reader corresponds to a wire ID included in the wire harness job table, and if the wire ID cannot be determined based on the wire harness job table, indicating the wire as non-compliant for the present wire harness job.

Moreover, the process may further include automated diagnostics, performed by implementing the steps of prompting the user to insert the wire into the respective illuminated pin-hole receptacle cavity in the connector and to confirm when insertion is complete, and determining whether insertion of the wire into the respective illuminated pin-hole receptacle has been completed using a sensor mounted on the translation stage and configured to detect a reflection of light from the wire or wire tip inserted into the illuminated pin-hole receptacle.

These and other aspects of the present invention are realized in a system and method as shown and described in the following FIGS. and related description. Additional features and advantages of the invention will be set forth in the detailed description which follows, taken in conjunction with the accompanying drawings, which together illustrate by way of example, the features of the invention.

BRIEF DESCRIPTION OF THE DRAWINGS

Various embodiments of the present invention are shown and described in reference to the numbered drawings wherein.

Figure 1:
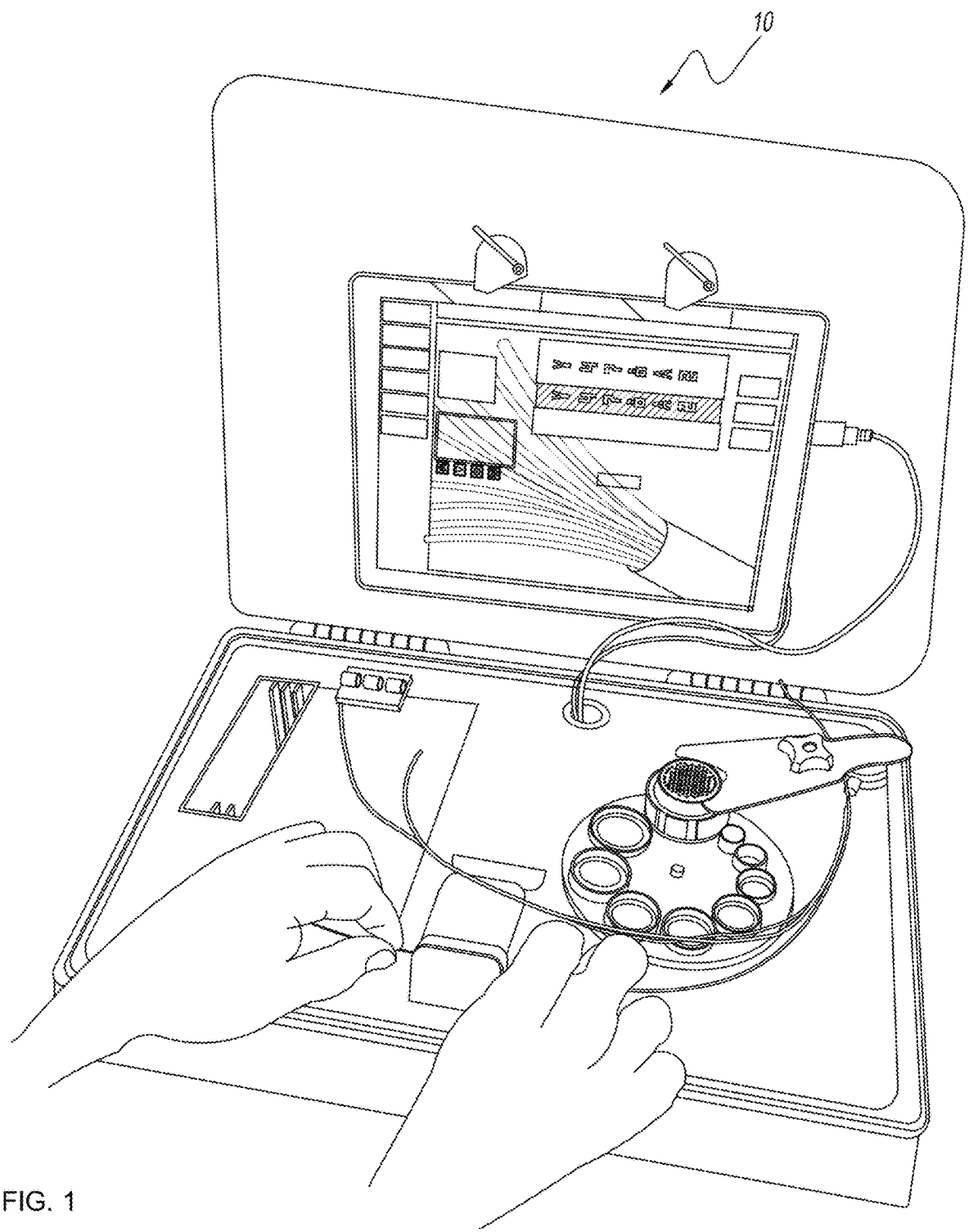
FIG. 1 depicts a photo of a user employing the system.

It will be appreciated that the drawings are for illustrative purposes only and not limiting of the scope of the invention which is defined by the appended claims. The embodiments shown accomplish various aspects and objects of the invention. It is appreciated that it is not possible to clearly show each element and aspect of the invention in a single FIG., and as such, multiple FIGS. are presented to separately illustrate the various details of the invention in greater clarity. Similarly, not every embodiment need accomplish all advantages of the present invention.

DETAILED DESCRIPTION

The invention and accompanying drawings will now be discussed so as to enable one skilled in the art to practice the present invention. These, and other, aspects and objects of the present invention will be better appreciated and understood when considered in conjunction with the following description along with the accompanying drawings.

It should be understood, however, that the following description, while indicating preferred embodiments of the present invention and numerous specific details thereof, is given by way of illustration and not of limitation. The drawings and following description are exemplary of various aspects of the invention and are not intended to narrow the scope of the appended claims.

Many changes and modifications may be made within the scope of the present invention without departing from the spirit thereof and the invention includes all such modifications. For instance, although the detailed description deals primarily with systems and processes for building wire harnesses or cable assemblies for aviation applications, it should be understood that such systems and processes apply equally as well to automotive, computer, architectural, marine vessel, satellite and other applications requiring assembly of wire harnesses.

Wire harnesses are essentially bundles of wires. Wire harness connectors have pin-hole receptacles (cavities) into which wire tips or wire pins at one end of a wire are inserted. Not all of the wires in a particular wire harness terminate at the same harness connectors. In large aircraft, such as the Boeing 747 or the Airbus 380, there are hundreds of miles of wire and hundreds or thousands of different types and sizes of harness connectors.

In many cases, one end of wire is terminated in the wire connector on the production line shop floor of the wire harness manufacturer while the other end of the wire is left to be terminated in a corresponding wire connector at the appropriate location, such as inside the aircraft. The apparatus and system of the present method have an advantage in portability in that it can be packed into a single carrying case for easy transportation, set-up and tear-down within the aircraft during wire insertion or its components may be used individually or in combination.

Wire harnesses and cable assemblies continue to be manufactured primarily by hand. The many different processes involved, and the complexity of the tasks required make automation of these processes and tasks a challenging proposition. Some wire harness connectors make for extremely complex assembly, such as the Amphenol MIL-DTL-38999 with as many as 128 pin-cavities in an area less than 2 inches in diameter. Inserting 128 wires, pins or seals into their matching pin-hole cavities without any opens, shorts or mis-wires takes considerable skill and time. Conventional methods for performing the hand-manufacture of wire harnesses typically require a specialized work bench or form board (sometimes also called Vertical boards or A-frame) and instrumentation.

Conventional systems and processes for building wire harnesses and cable assemblies often fail to provide sufficiently clear indication or marking of a pin-hole receptacle for wire insertion, and they also fail to determine if that wires or wire tips are inserted into the correct pin-cavity receptacles.

Conventional wire insertion systems employ techniques, such as topside illumination of the pin-hole receptacle using a laser or graphical indicator overlays within a video image of the harness connector. These systems do not provide sufficiently clear indication of the correct pin-hole receptacle because previously inserted wires may block the topside laser from illuminating the correct pin-hole cavity and they also can make images with graphical indicator overlays confusing.

In addition, when the user begins to move the wire tip or wire pin into place, their hand or wire will necessarily block any topside illumination, at least momentarily, prior to insertion, resulting in incomplete reduction in human error—for instance, if and when the topside laser is blocked, the user may fail to identify or locate exactly which pin-hole receptacle had been illuminated.

The apparatus, system and process of the present invention greatly facilitates an efficient insertion/termination of wire into the connector and thus reduce the amount of time required in various modes of harness assembly: on a work bench within limited physical space, on a form board (also known as Vertical Board or A-frame), or inside the structure such as an aircraft, ship, or a submarine where the harness would be installed. More specifically, in preferred embodiments, the apparatus of the present invention is (a) contained within a compact carrying case (molded, watertight and portable) for safe and easy transport, set-up and break-down or (b) hand-held for portability. An integrated, computer-implemented system executes a series of process steps designed to automate the identification of wires and guide their error-free insertion into designated sites in a connector to assemble a wire harness and thereby reduce the amount of time necessary for assembly of the wire harness. In working with form board assisted wire harness assembly, i.e., a Vertical Board or A-frame, a preferred embodiment of the present invention includes a separate, independent insertion stage module that may be employed by a wire harness worker in tight spaces, such as with in-situ assembly within an airplane fuselage, and which is connected to the other unbundled components of the present invention.

The present invention ensures that illumination of the pin-hole cavity indicated for wire insertion is not blocked by the user's hands or previously inserted wires by illuminating the pin-hole receptacle from below. Only one system in the prior art, the CAMI Research Light Director system, also provides illumination of the pin-hole receptacle from below. However, the CAMI system relies on custom-built device, in which optical fibers must be correctly affixed to the underside of the correct pin-hole, effectively duplicating the wiring work, just with optical fibers rather than electrical wires. The CAMI system also requires a custom-built fixture to be fabricated for each connector type, which is a very expensive proposition because, for example, a commercial airplane can have hundreds or thousands of connector types.

Further, many conventional systems still require manual or other user input of a wire ID, such as manually reading alphanumeric wire ID and then typing onto a keyboard or speaking the wire ID into a microphone, in order to identify the corresponding pin-hole receptacle for wire insertion both of which involve human intervention which is slower and prone to errors such as typos. Other systems enable automatic entry of wire ID, such as through bar-code scanning.

Moreover, even though optical character recognition (OCR) has not been incorporated into any known prior art systems discussed above, OCR is a known and convenient means of machine reading. And to the best of our knowledge, we are the first group to have integrated OCR into automated wire ID reading and capture, and also for wire harness assembly. Our efforts to do so have had to overcome many technical challenges on the path to successful integration.

One of the primary challenges faced by conventional optical character scanners is correctly reading alphanumeric characters that are printed on a round wire surface, especially for higher-gauge, thinner-diameter wires. This is because the full dimension of the alphanumeric characters extends beyond the horizon or curvature of the wire. In fact, improvements in wire manufacture are driving two current industry trends in aerospace and aviation: 1) for the same wire gauge (AWG), newer wire constructions have more efficient, thinner insulation, and consequently thinner outside diameters; and 2) increasing use of higher AWG wires, which have a thinner cross-sectional diameter of the metal or conductor, to further reduce total weight of the entire wire infrastructure. Currently, 24-gauge wire is the thinnest diameter wire, at just barely over 0.5 mm diameter. However, industry has started using 26- and 28-gauge wires, with diameters of just 0.40 and 0.32 mm, respectively. This change will reduce the fixed tare (i.e., empty) weight of an aircraft by thousands of pounds, a much-desired technological improvement, but one which also results in wire markings that are more intractable to machine vision and OCR solutions.

Also confronting this technological advancement is the analogous challenge that the thinner the wire, the greater the rate of human error in reading the wire markings, thus making a machine vision and OCR solutions all the more important and desirable. For these higher gauge wires, as previously discussed, the full dimension of the markings are not entirely contained within one single 120-degree view but invariably spill over the horizon of the curvature of the wire ("the horizon"). This means that the wire must be rotated to fully read it with the human eye, even when using visual aids such as magnifiers. Machine vision and OCR wiremarking reading accuracy may be further improved by using OCR fonts, such as OCR-A and OCR-B; however, these specialized fonts do not help overcome the challenges associated with standard machine vision and reading of alphanumeric characters printed on the highly-curved surfaces of thin wires.

For these higher-gauge, smaller-diameter, thinner wires, manually reading alphanumeric characters becomes progressively more challenging. Differences between the characters '5' (five) and 'S', '3' (three) or '8' (eight) and 'B', '1' (one) and 'L', '0' (zero) and 'D' and between '2' (two) and 'Z' can be especially difficult to distinguish. On average, it takes a wire harness worker approximately 2.5 to 3 minutes per wire to 1) read the wire marking by eye, 2) then type the wire marking into the computer, 3) for the computer to match the wire marking with the database wire ID and a pin-hole receptacle ID. Then the worker takes another 2 minutes to locate the pin-cavity in the connector, and to finally place the wire tip or wire pin into the correct pin-hole receptacle. The total time per wire end may thus be 3 to 5 minutes.

With conventional systems, per current industry norm, error rates for wire mis-insertion are between eight percent (8%) and twelve percent (12%). And, because wire tips or wire pins must lock into a pin-hole in the connector when they are inserted, rework time for correcting such mistakes can take between five times (5×) to ten times (10×) longer than an initial correct insertion. This means that it can take upwards of 10-15 minutes, and easily longer, to fix one misplaced wire. Further aggravating the problem with conventional systems, it is not unusual for a single error in wire placement to have cascading effects, resulting in many misplaced wires in a single harness connector. These cascading errors can quickly add up to make production of the wire harness a negative profits exercise.

To overcome these challenges faced by conventional systems, the viewer of the present invention provides a full 360-degree view around the wire. Individual 120-degree views are insufficient, so the system integrates three or more independent camera images on the image plane of the camera, each viewing the wire from a different angle of observation, to provide a full 360-degree view by combination of the three or more segmented views, as depicted in FIG. 1. The top view in FIG. 1 depicts the reassembled image obtained by combining three or more separate views of the wire markings. And, the bottom view in FIG. 1 depicts a white lettering on black background machine vision optical character recognition (OCR) of the wire markings, as imaged using three or more individual camera angles and image capture devices.

Figure 2:
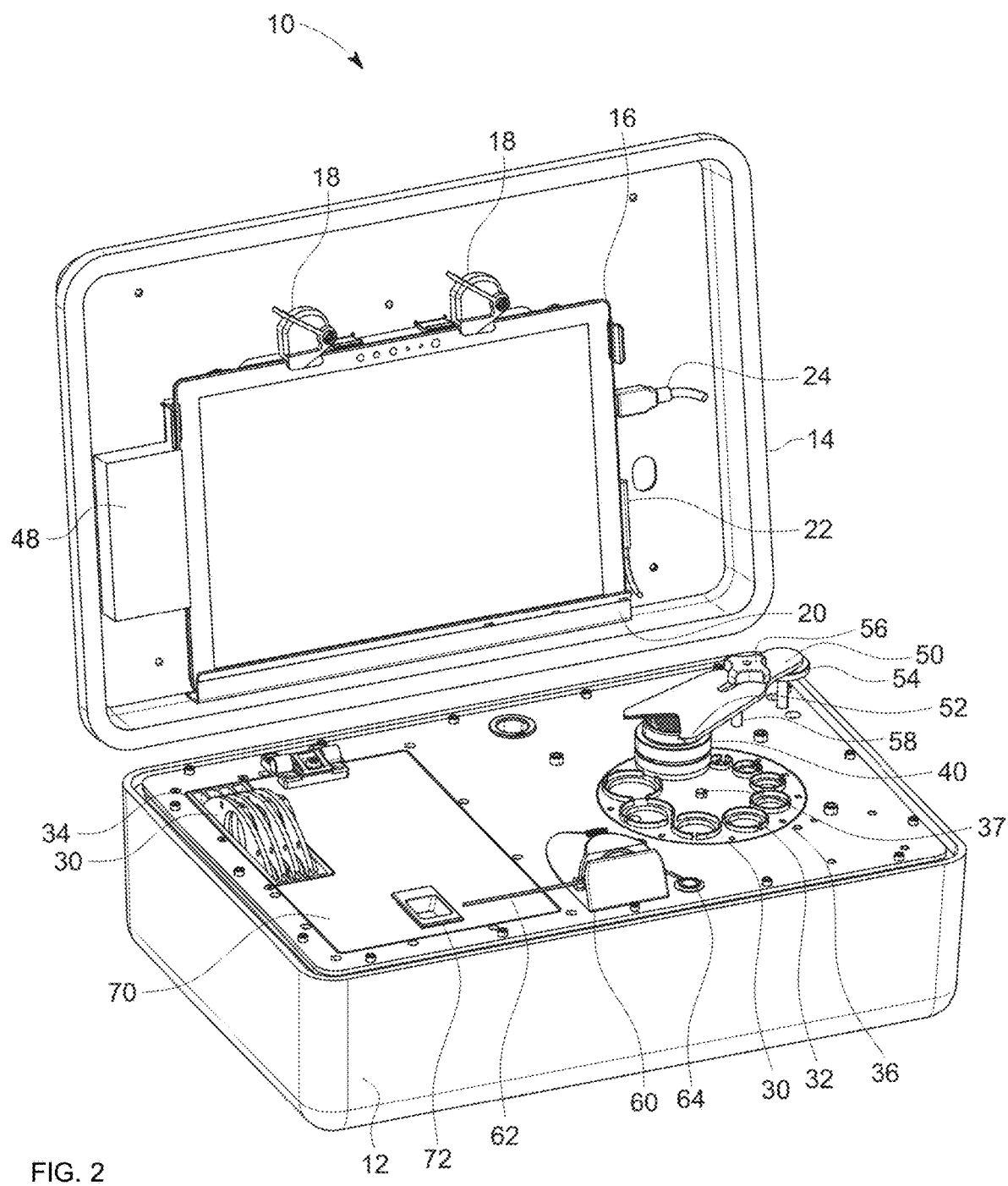
FIG. 2 depicts a view of the visible system components, contained within a carrying case.
Figure 3:
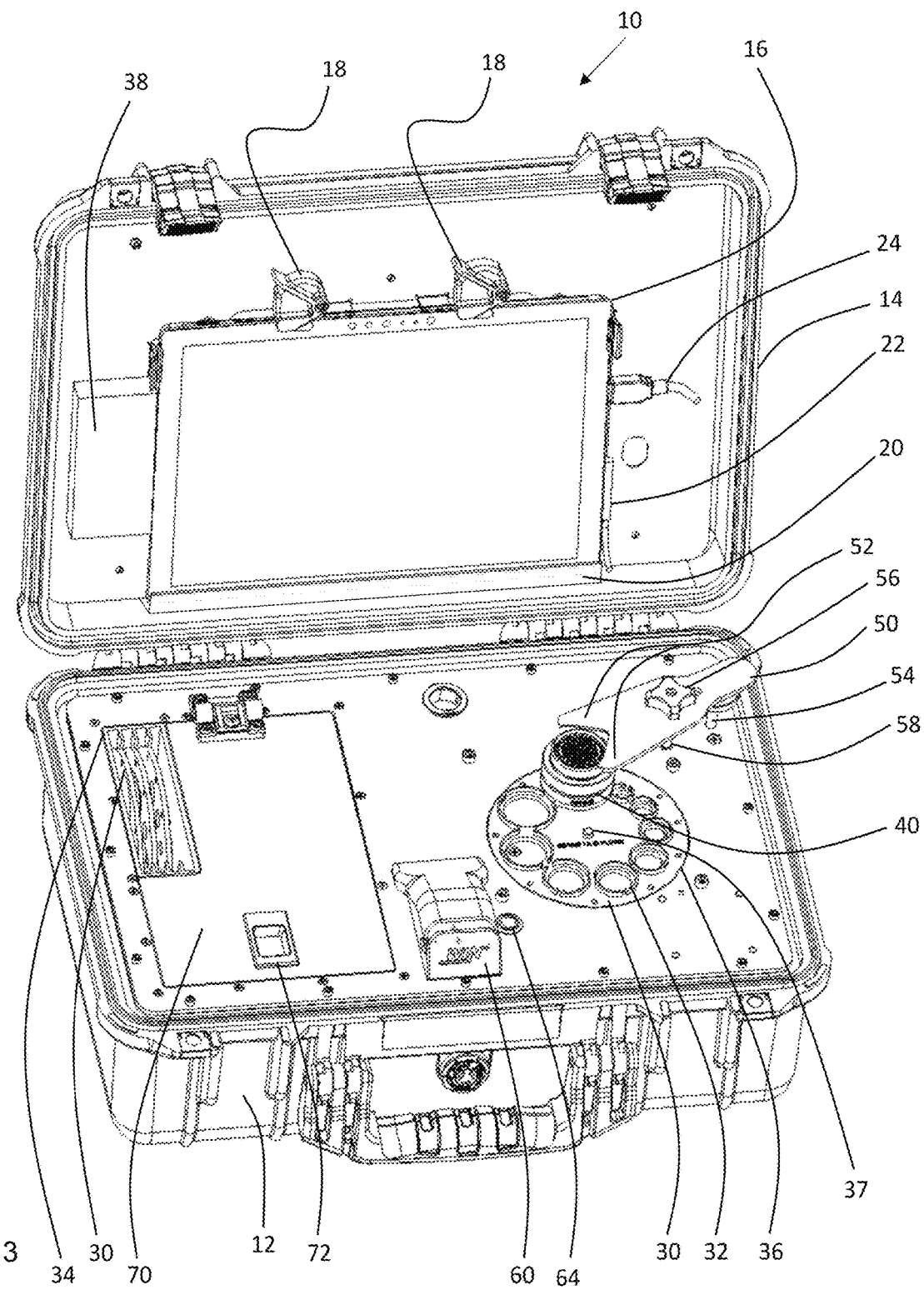
FIG. 3 depicts another view of the system components, contained within the carrying case.

As shown in FIGS. 2 and 3, the apparatus and system 10 of the present invention are capable of being contained entirely within a case or box 12 and top cover 14, such as a pelican case or other portable carrying case. However, but the system 10 may also be implemented as separate, independent modular components, that remain interconnected but in an unbundled physical format. In a preferred embodiment, the carrying case is ruggedized and equipped with a watertight seal to prevent infiltration of water and dust particles.

The computer 16 is responsible for displaying, connecting the components of the system, integrating the data generated by various system components and sending data and commands to various system components, as well as implementing the process of the present invention, may be housed within the top cover 14 of the case or box 12, as shown in FIGS. 1-3. As used in this patent application, computer shall be defined to include server computers, desktop computers, laptop computers, tablet computers, smartphones and all other types of stationary and mobile computers, especially computers that are highly interconnected through wireless means, such as WiFi, Bluetooth, cellular, satellite and other wireless networks.

Figure 4:
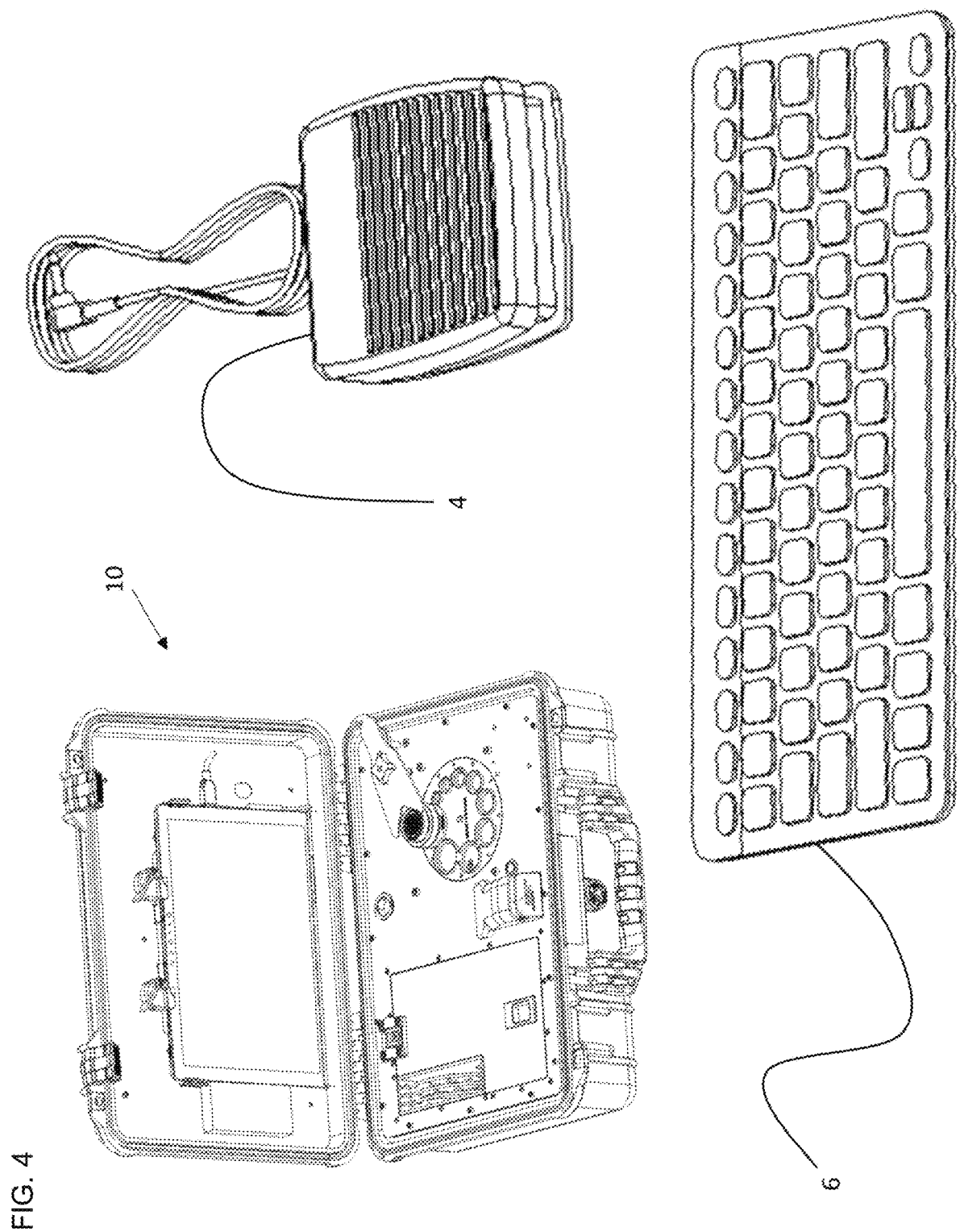
FIG. 4 depicts some of the optional system accessories, exemplified here by a foot pedal and keyboard.

As shown in FIG. 4, a keyboard 6 and/or mouse may also be included in the carrying case. Specifically, the keyboard 6 may be stored behind the computer 16 in the top cover 14, as shown in FIG. 4. A foot switch 4 can also be connected to the system for added functionality.

The invention may further include various attachment mechanisms enabled to secure the computer 16 to the top cover 14, such as switch tab locks 18 and supporting rigid clamp 20, as shown in FIGS. 1-3. Further, the computer must have a power source or a connection to a power source 22 and one or more data input and data output ports 24 to enable the computer to connect the system components, receive data from and send data and commands to system components.

Additional components of a preferred embodiment of the present invention include one or more cassette trays 30, having harness connector receptacles 32 for holding in place one or more harness connectors 40. Cassette trays 30 may be stored in a cassette tray holder 34, which may include a top compartment or stabilizer 48 (such as a piece of foam) to prevent movement or jostling of the additional cassette trays during transport.

When the computer 16 indicates that a specific cassette tray is required for a selected wire harness assembly job, that cassette tray 30 is retrieved from the holder 34 by the user and placed on a cassette tray platform 36 for use in securing the necessary wire harness connector 40.

Figure 5:
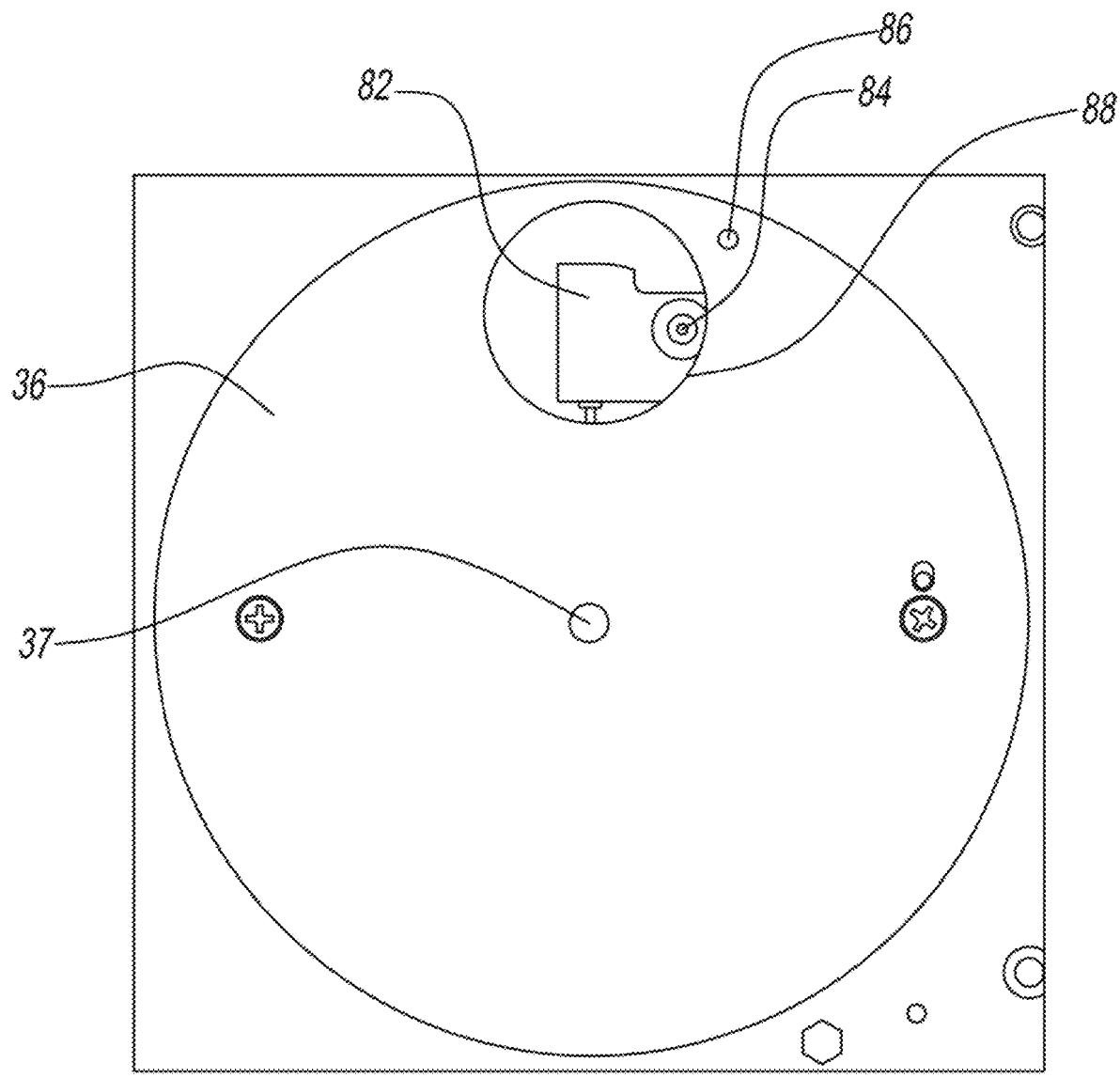
FIG. 5 depicts a close up top-down view of the cassette tray platform with the central locating pin, the indexing pin, and the cut-out through which the light source illuminates the back side of a harness connector.

In one embodiment, as shown in FIGS. 1-3 and 5, the cassette tray platform 36, may be affixed to the case 12, nominally $1/16^{th}$-inch below the surface of the case. This tray platform has an opening cut-out 88 that is large enough to allow the light beam from the light source 84 mounted on the translating X-Y gantry carriage 82 below or behind the harness connector 40 to address and illuminate every individual pin-cavity in the connector 40, one at a time, in a completely unobstructed manner. The cassette tray platform may also be equipped with a center locating pin 37 (FIGS. 1-3 and 5) and a small indexing pin 86, which may be located near the perimeter of the cassette tray platform (as shown in FIG. 5).

Taken together, the center locating pin 37 and the perimeter indexing pin 86 of the cassette tray serve two functions. First, they are used to ensure that, during wire insertion, the cassette tray 30 remains firmly stationary i.e. it does not rotate relative to the tray platform 36. Second, they ensure that the connector receptacle 32 in the cassette tray 30 and the connector 40 sitting in that receptacle 32 in the cassette tray are both linearly aligned with the translational gantry carriage 82 below the surface to allow the illuminating light 84 to position itself precisely under the designated pin cavity in the connector 40.

Figure 6:
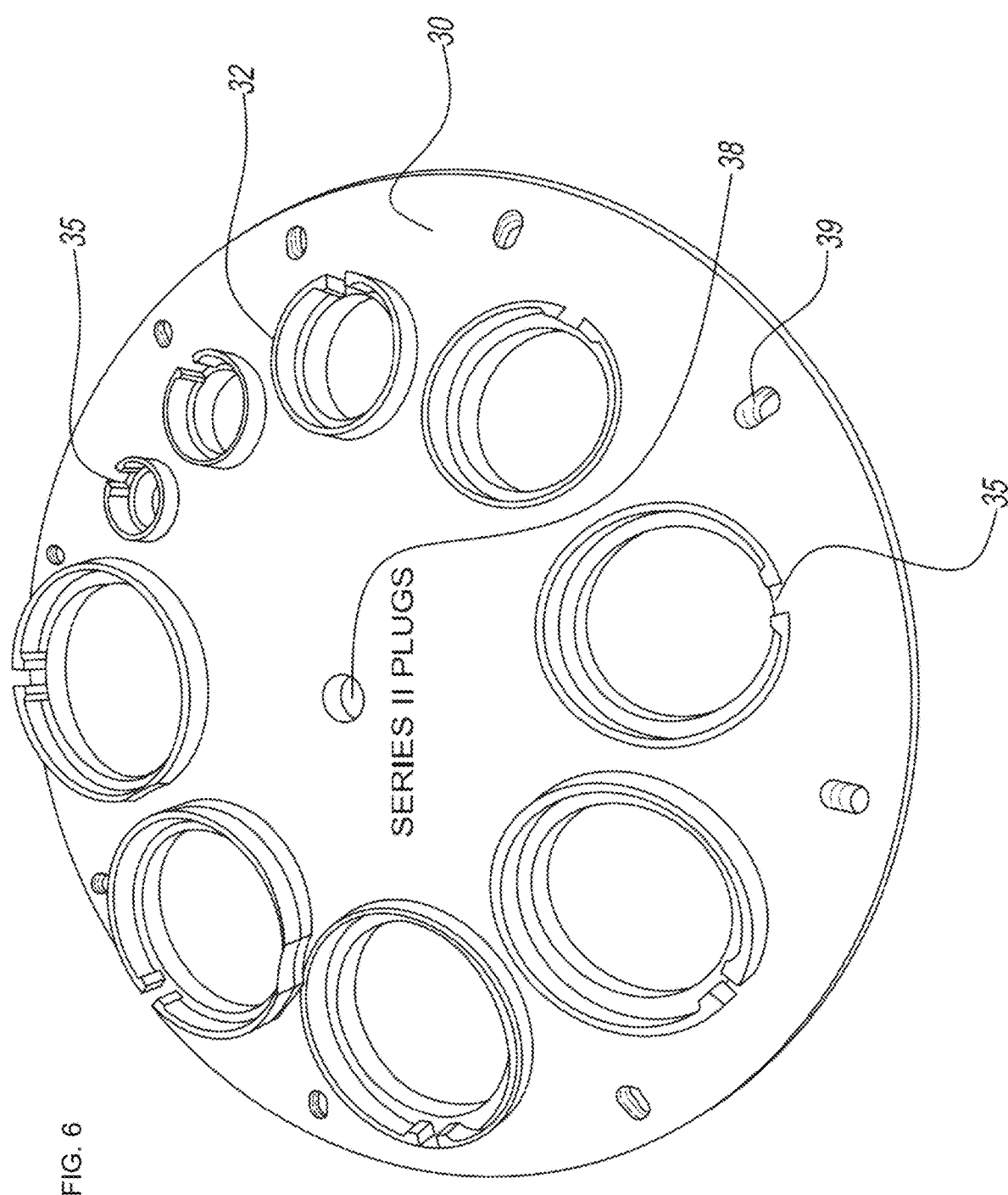
FIG. 6 depicts a cassette tray having female slot or notch receptacles that correspond to matching rib or tab male harness connector locking mechanisms.
Figure 8:
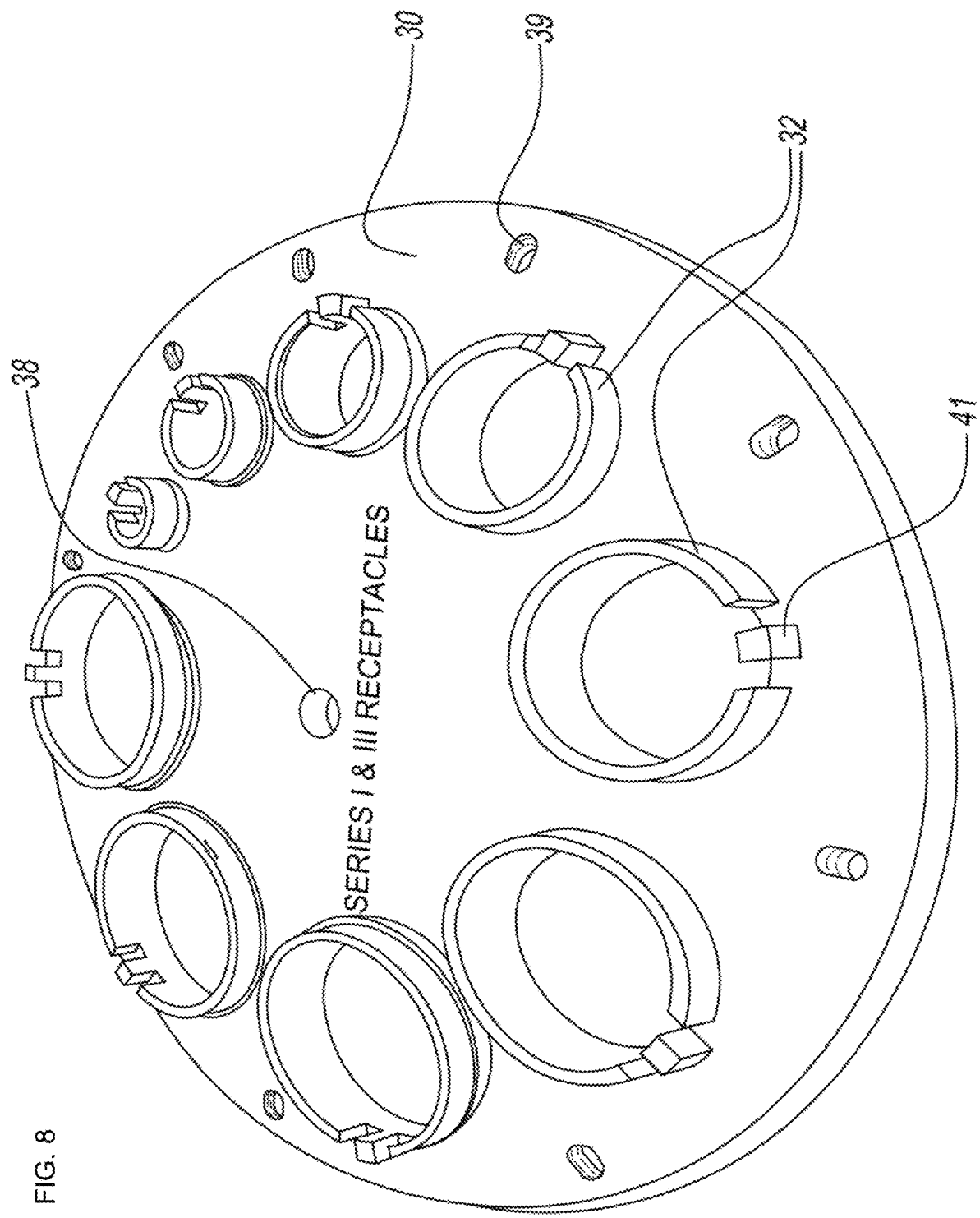
FIG. 8 depicts a cassette tray having male rib or tab receptacles that correspond to matching slot or notch female harness connector locking mechanisms.

In a preferred embodiment, as shown in FIGS. 5, 6 and 8, the connector tray has a center locating hole 38 and a small perimeter indexing hole 39 located next to each connector receptacle 32. When the tray 30 is placed in the tray platform 36, the center pin 37 of the tray platform sits in the center hole 39 of the cassette tray, and the small indexing pin 86 sits in the perimeter indexing hole 39. This two-pin mechanism, or any similar alignment mechanism, ensures there is no relative rotational movement between the cassette tray 30 and the tray platform 36.

Figure 9:
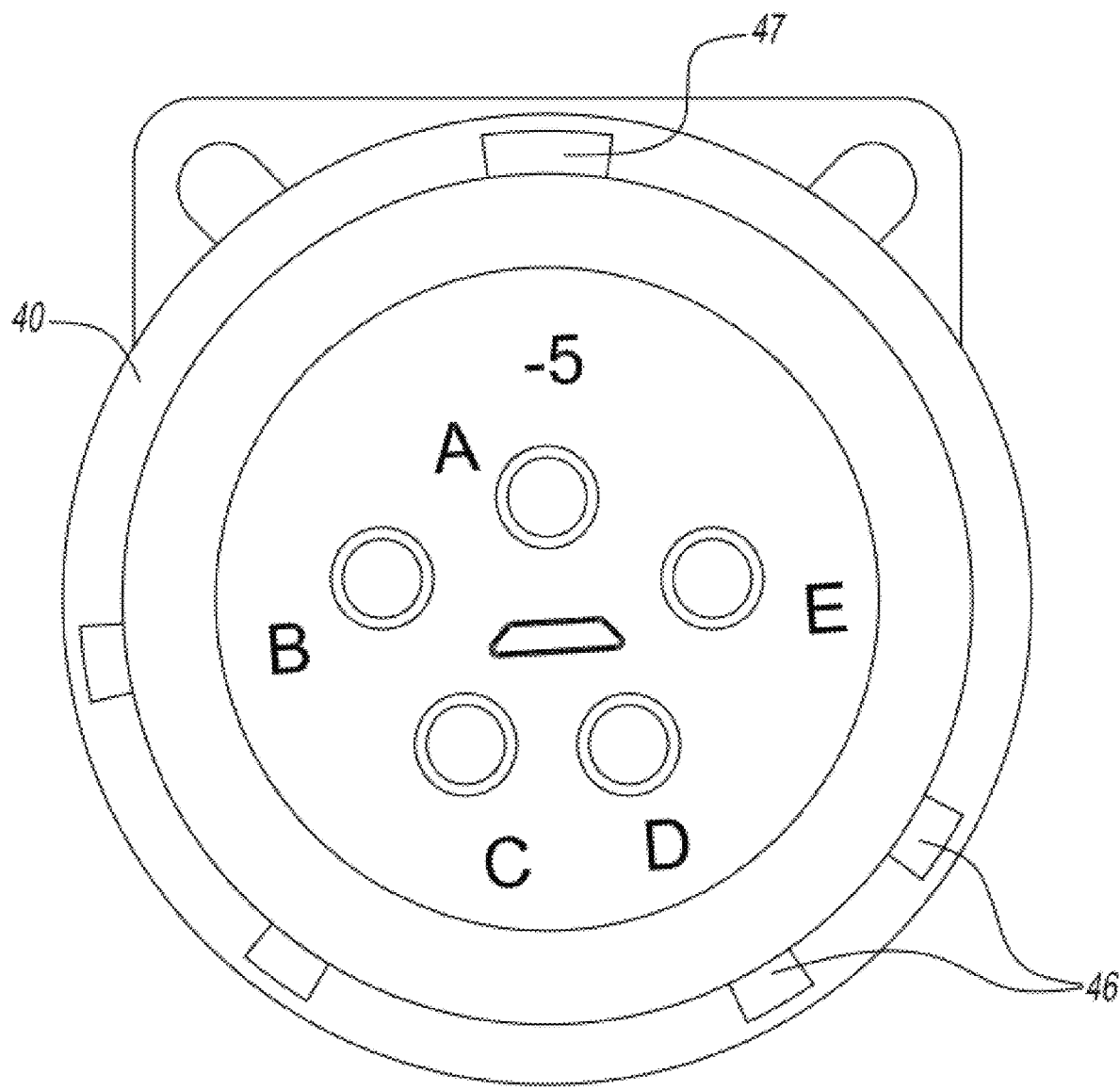
FIG. 9 depicts a corresponding female harness connector locking mechanism comprising several smaller slots or notches and one large slot or notch that matches the rib or tab of the male harness connector receptacle shown in FIG. 8.
Figure 10:
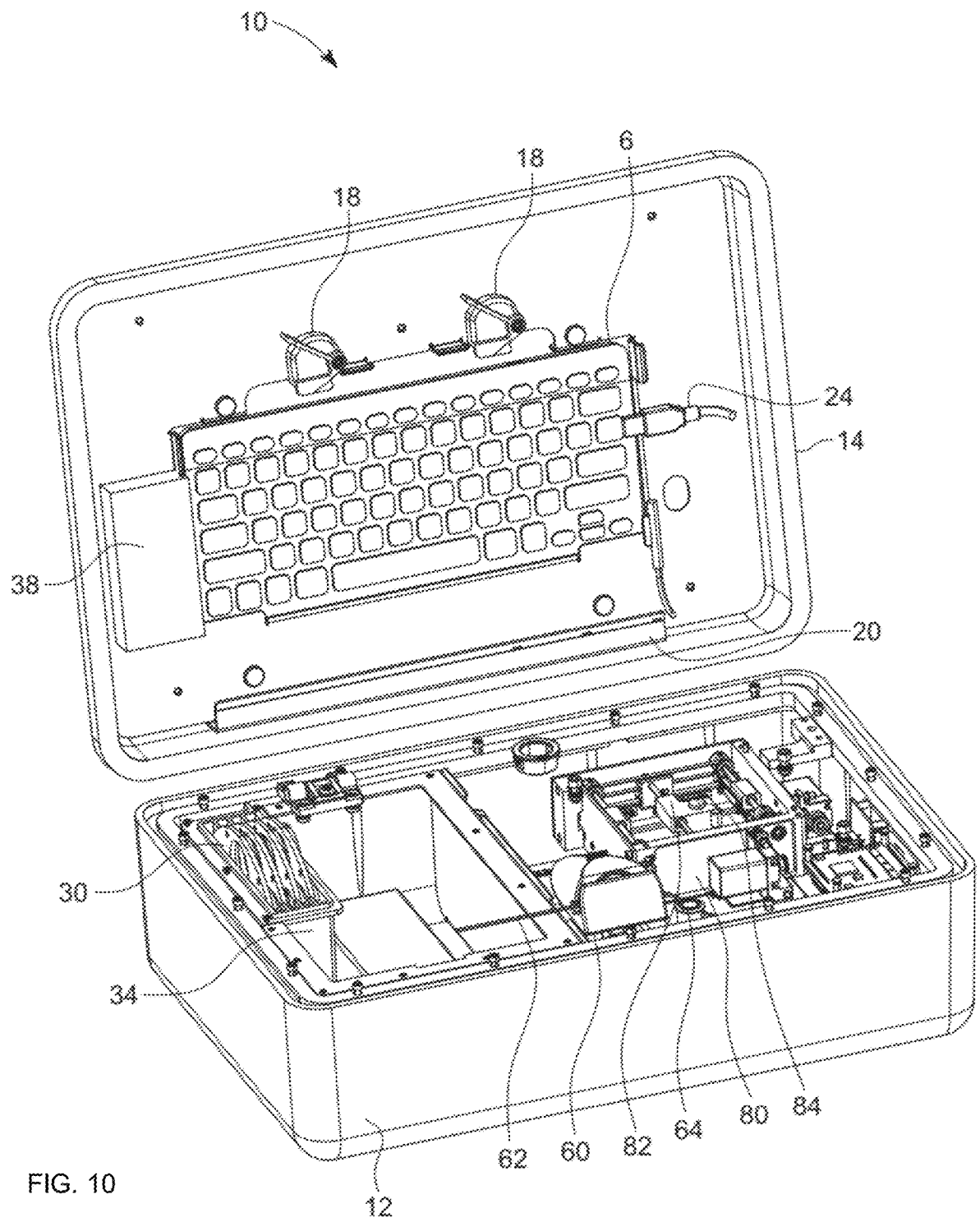
FIG. 10 depicts an interior (sub-surface) view of the carrying case, including some of the system internal components not readily visible to the user.

In another preferred embodiment, as shown in FIGS. 6 and 8 for purposes of illustration, there are separate cassette trays for male connectors (also called plugs, FIG. 7) and female connectors (also called sockets, FIG. 9). The difference between the trays 30 for the male and female connector types lies in the mechanisms for locking the connector 40 into place in the corresponding cassette tray 30. In other embodiments, both plug and socket receptacles may be integrated within a single cassette tray, depending on user preference.

Figure 7:
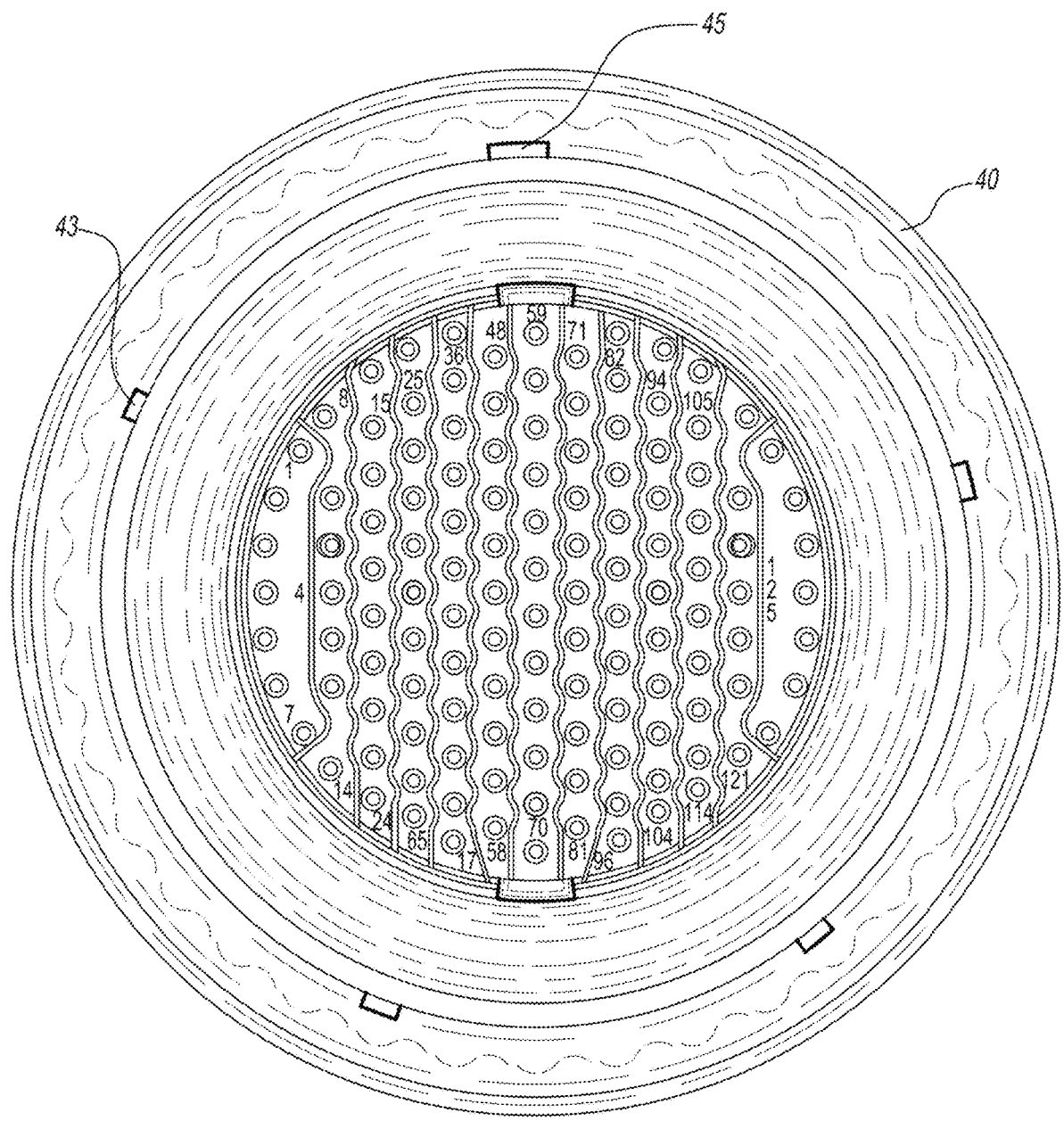
FIG. 7 depicts a corresponding male harness connector locking mechanism comprising several smaller tabs or ribs and one large tab or rib that matches the slot or notch of the female harness connector receptacle shown in FIG. 6.

Further, each male (plug) wire harness connector 40, an example of which is shown in FIG. 7, may be equipped with a few smaller, narrow tabs or ribs 43 and one larger, wider tab or rib 45. Its corresponding receptacle 32 in the designated cassette tray 30 (FIG. 6) has a matching slot or notch 35 configured to receive the wider tab or rib and wherein the wider tab or rib is seated.

In a similar manner, each female (socket) wire harness connector 40, an example of which is shown in FIG. 9, may be equipped with a few smaller, narrow slots or notches 46 and one larger, wider slot or notch 47. Its corresponding receptacle 32 of the designated cassette tray 30 may have a matching tab or rib 41, as shown in FIG. 8. Female receptacle connectors will always be equipped with at least one notch, and when they are equipped with more than one notch, one of the notches will be larger and configured to fit onto a rib or tab of a cassette receptacle 32.

These male (FIGS. 6-7) and female (FIGS. 8-9) tab-slot pairings ensure that once the connector 40 is seated in its designated receptacle 32, it cannot have any rotational movement. Taken together, the preceding descriptions of cassette tray platform, cassette tray and wire harness connector locking mechanisms accomplish a precise X-Y axis alignment for each connector pin-hole cavity receptacle 42 (FIGS. 11,12) in the connector over the illuminating light source 84, to guide wire insertion and perform diagnostics to ensure error-free wire-insertion.

In addition, each cassette tray may be equipped with an indexing hole 39 at the outer perimeter of the cassette tray 30, with each such indexing hole placed near the corresponding harness connector receptacle 32, and the cassette tray platform 36 (FIG. 5) may have a corresponding indexing pin 86, configured to fit into the indexing holes 39 and enable the cassette tray to easily lock into place for a selected harness connector receptacle 32. In some preferred embodiments, instead of a fixed indexing pin, the cassette tray platform 36 may be equipped with a spring-loaded indexing pin, designed to fit into the indexing holes while allowing the user to easily spin the cassette tray in place through each lockable indexed position on the cassette tray platform 36. The spring-loaded indexing pin may have a sloped top surface forming a wedge shape, to enable the cassette tray to more easily spin in a preferential direction.

As previously discussed, in certain preferred embodiments the cassette tray platform 36, cassette tray 30 and the two-axis translational stage or gantry 80 (FIGS. 13-16) may comprise an independent, separate insertion stage module, which comprises the cassette tray, stacked on top or in front of a connector tray platform that is in turn placed above or in front of an illuminating light source 84 that is mounted on carriage 82 of an X-Y translation gantry 80.

The case or box 12 may further include a multi-use storage area 70 (FIGS. 1-3, 10, 15 and 17) with a locking mechanism 72, configured to secure items such as a power cord, additional cassette trays 30, harness connectors 40, a foot switch 4 and other equipment that may be useful for the purposes of completing a wire harness assembly job.

A preferred embodiment of the present invention may further include a harness connector clamp, which, as shown in FIGS. 1-3, may include a clamp bar 50 with a clamp bar fork 52 for fitting around the rim of the harness connector 40, a rear fulcrum 54, a wing nut 56 and locking bolt 58.

To lock a harness connector into the harness connector receptacle of a cassette tray 30, the user would first place the harness connector 40 into the harness connector receptacle 32. Next, the user would set the height of the rear fulcrum 54, by tightening the jack screw, and set the tines of the clamp bar fork 52 around the rim of the harness connector. Lastly, the user would connect the wing nut 56 to the locking bolt 58 and tighten the wing nut until the clamp bar is firmly locked into place, preventing the harness connector from moving.

The foregoing is only an exemplary description of a method to secure the harness connector to the cassette tray. Alternatively, other means of securing the connector may be employed. As another example, instead of the harness connector clamp as depicted in the figures, the system may include a system of side clamps or a chuck to affix the harness connector in place. Any and all means for affixing and locking harness connectors in place, as are well known in the art, are intended to be included as potential variants of the connector holding mechanism.

The apparatus and system of the present invention also includes a wire marking reader 60, (alternatively called a "Viewer") comprising one or more of a camera, an imaging device or other suitable non-contact sensor apparatus, such as described in US patents U.S. Pat. Nos. 5,936,725A, 6,122,045A, and 6,233,350B1, which are herein incorporated by reference in their entirety. Further, the wire marking reader 60 is configured to detect and capture images of the wire markings included on the wire covering (insulation or a sleeve thereon) of a wire 62. As mentioned above, the viewer of the present invention overcomes the challenges faced by conventional systems, by providing a full 360-degree view around the wire, and providing accurate machine reading of the wire markings.

In addition, in a preferred embodiment, the wire marking reader 60 may include a set of wire grippers designed to accommodate a range of wire diameters. The wire grippers may be configured to grip a wire and hold it in place for optimal image capture. Three or more views from different angles cover the entire surface of the wire to provide a full 360-degree view of the wire. In addition, the viewer module incorporates a telecentric configuration of the image detectors/cameras, whereby the magnification of the wire image remains independent of the distance from the wire to the center of the viewer module reader.

In addition, the system software can be configured to give features and characters within an image proper size, shape and orientation by implementing manipulations of the captured image, including without limitation, de-curving the wire, de-rounding the wire and stretching edges near the horizon of the wire. The system software may further be configured to flip mirror images, ensure magnification matching, differentiate darkness and/or intensity between the wire manufacturer's markings and the aircraft manufacturer's markings on the wires, remove wire stripes and recombine features found in the three or more differently angled views of the 360-degree wire surface, i.e., reconnect character lines severed by the three or more different views. The number of cameras and views employed may be arbitrary, so long as the full 360-degree surface of the wire is encompassed by those views.

The system may also include an image capture button 64 configured to enable a user to capture an image of the wire markings displayed on the computer screen. Further, the system may be enabled to allow a user to use a touch screen, a foot switch 4, a keyboard 6 or a microphone for voice activated commands to control the system or some other means to capture images of wire markings.

Figure 11:
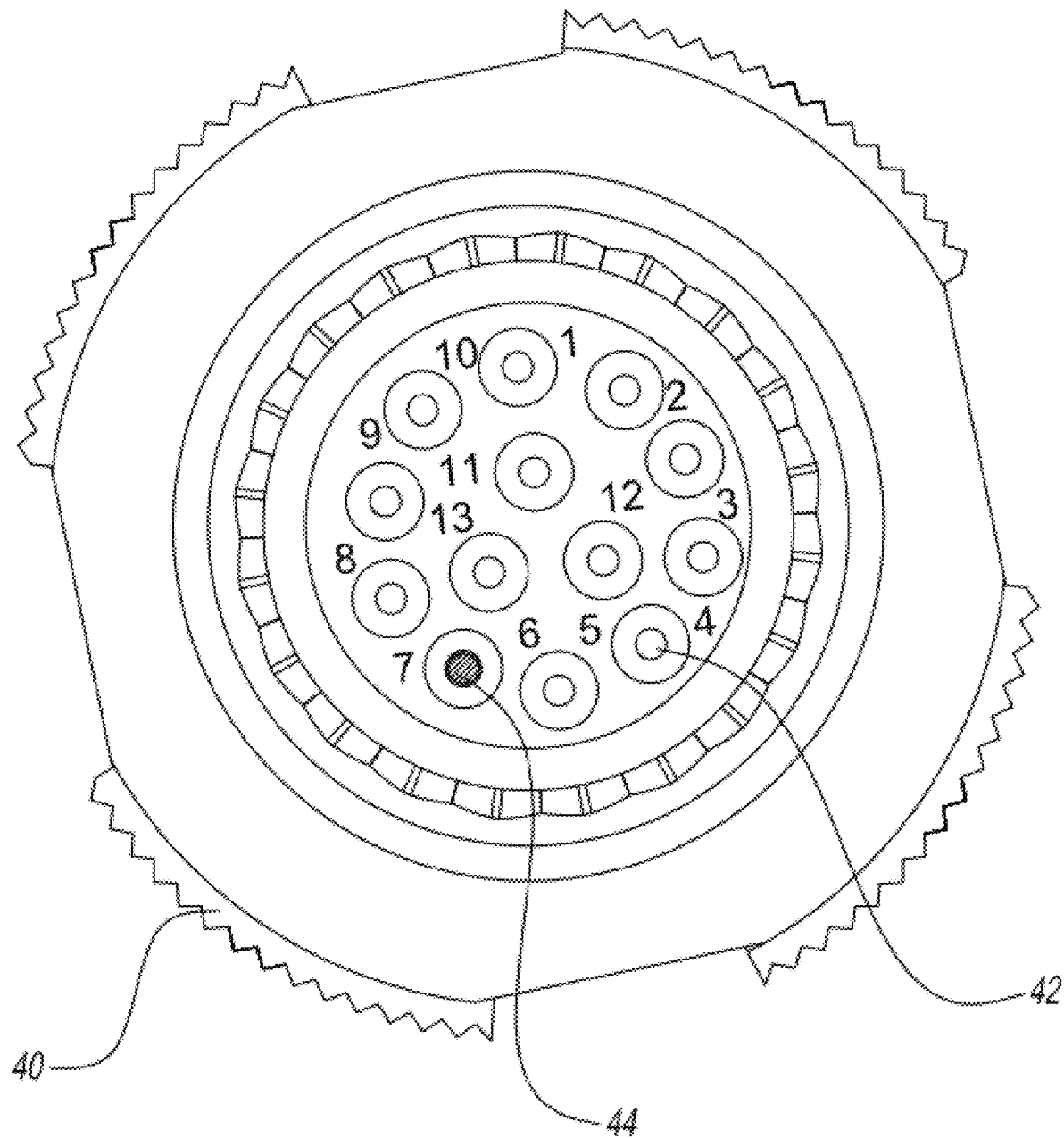
FIG. 11 depicts a top-down view of a harness connector, with a pin-hole receptacle illuminated from behind or below.
Figure 12:
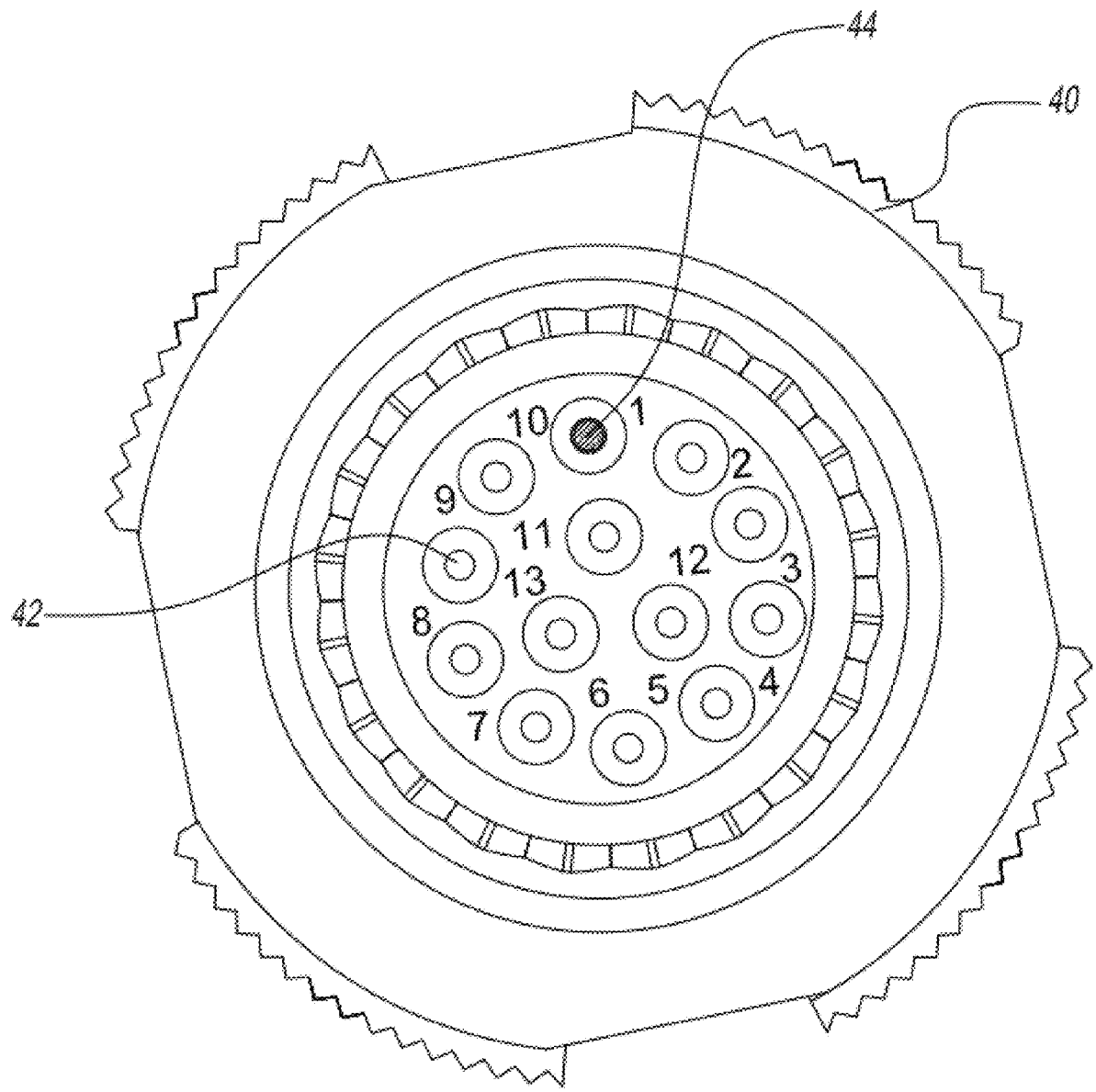
FIG. 12 depicts another top-down view of a harness connector, with a different pin-hole receptacle illuminated from behind or below.

The apparatus, system and process of the present invention facilitate the manufacture of wire harnesses by providing a user with automated identification of wire markings and illumination of corresponding pin-hole receptacles for wire insertion. As shown in FIGS. 11-12, the harness connector 40 has multiple pin-hole receptacles 42 and an illuminated pin-hole receptacle 44 directs the user to the correct pin-hole receptacle for wire insertion.

Figure 13:
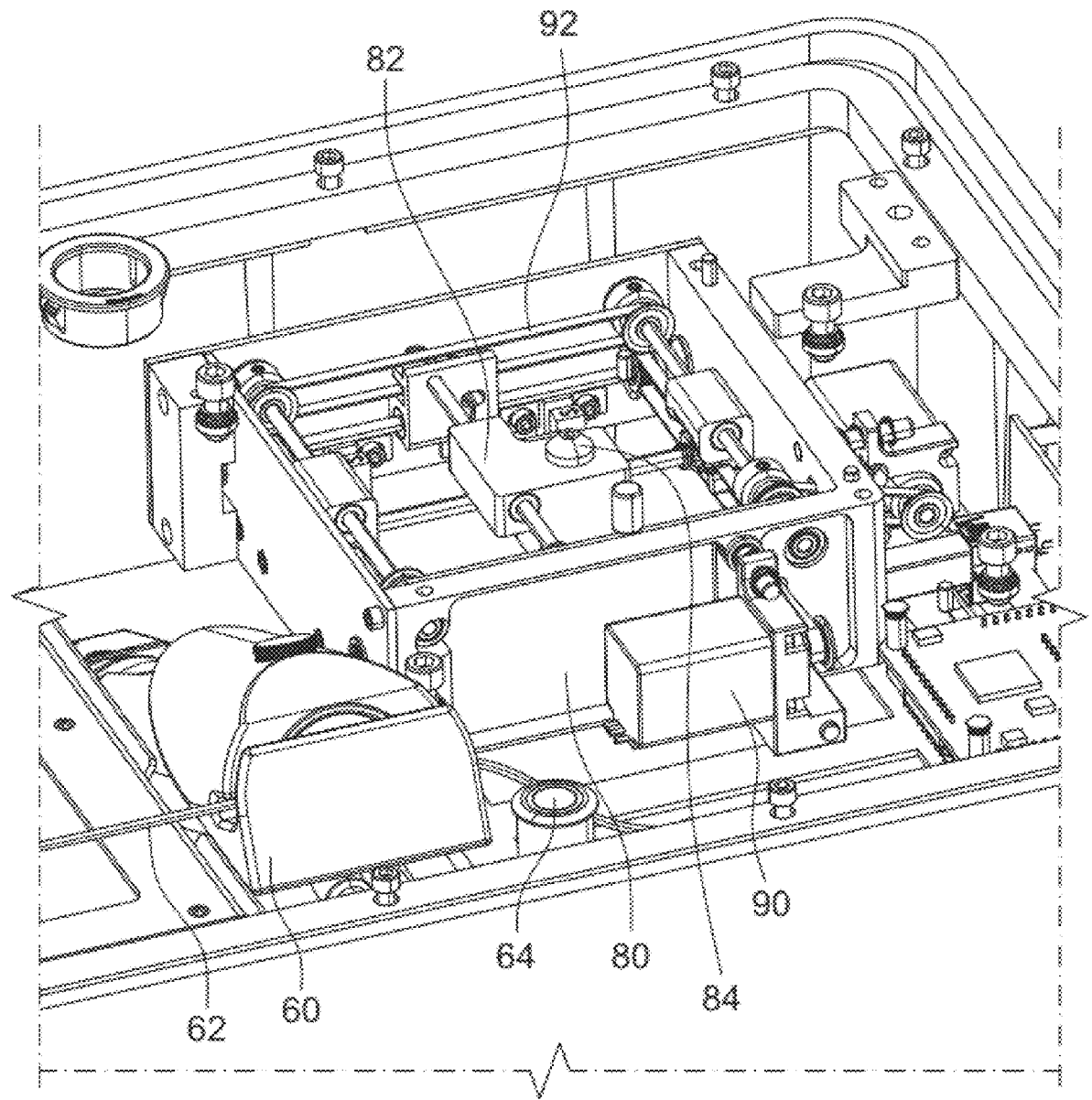
FIG. 13 depicts a close-up perspective view of the two-axis translation stage or gantry, in the interior of the carrying case.
Figure 14:
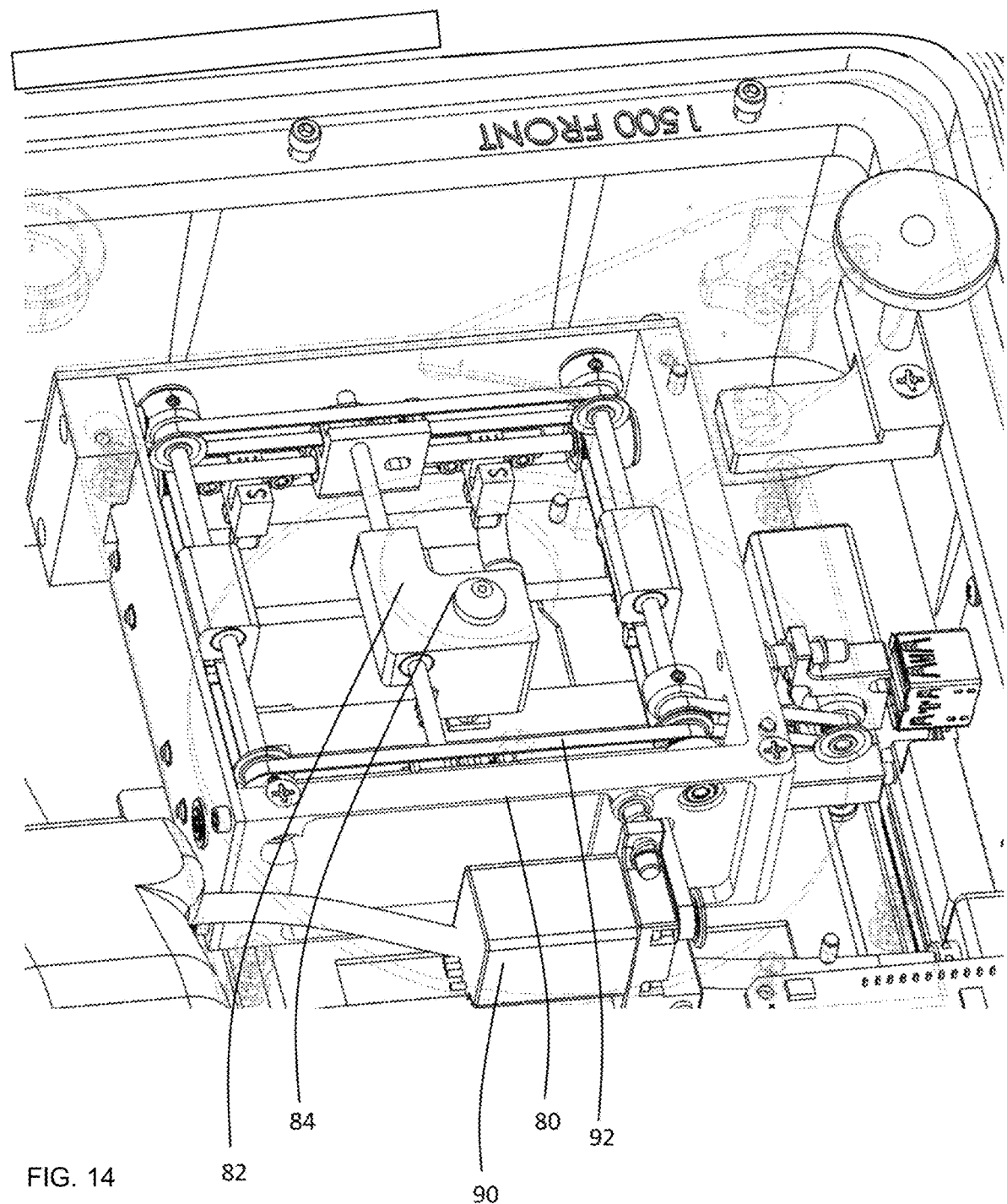
FIG. 14 depicts another close-up perspective of the two-axis translation stage or gantry, in the interior of the carrying case.
Figure 15:
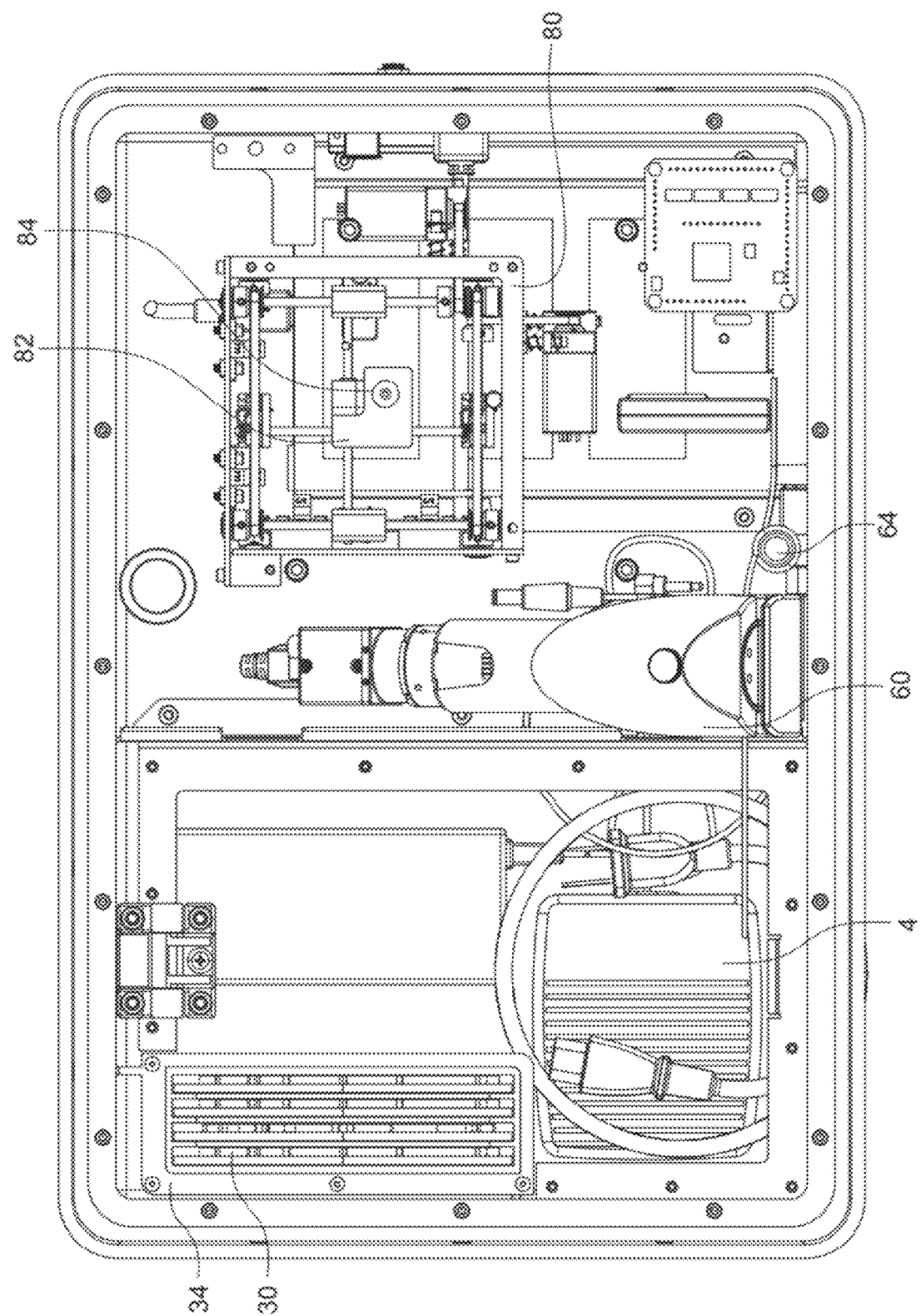
FIG. 15 depicts a top-down schematic view of the interior of the carrying case, including most of the system internal components.
Figure 16:
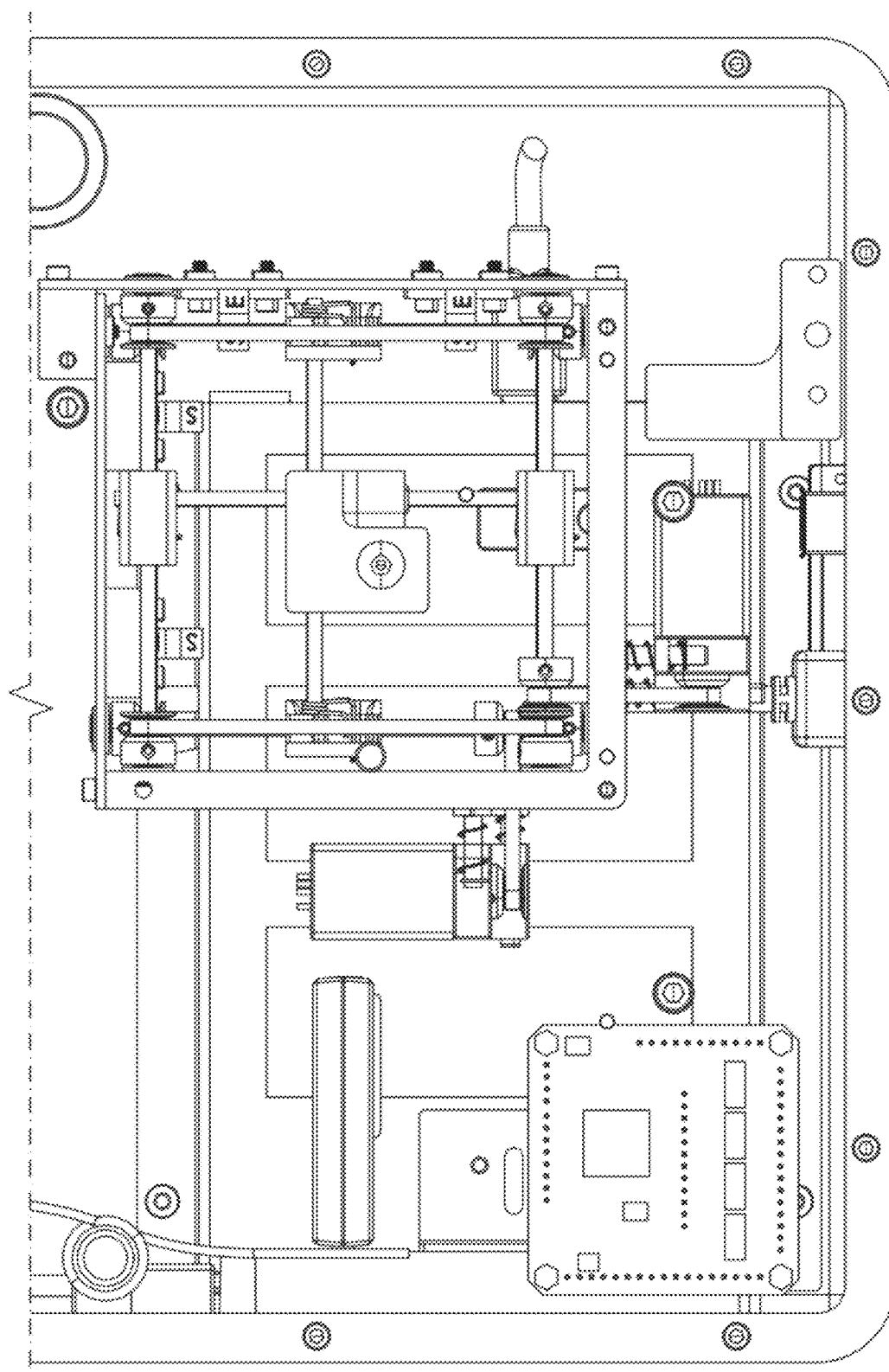
FIG. 16 depicts a close-up, top-down schematic view of the two-axis translation stage or gantry, in the interior of the carrying case.
Figure 17:
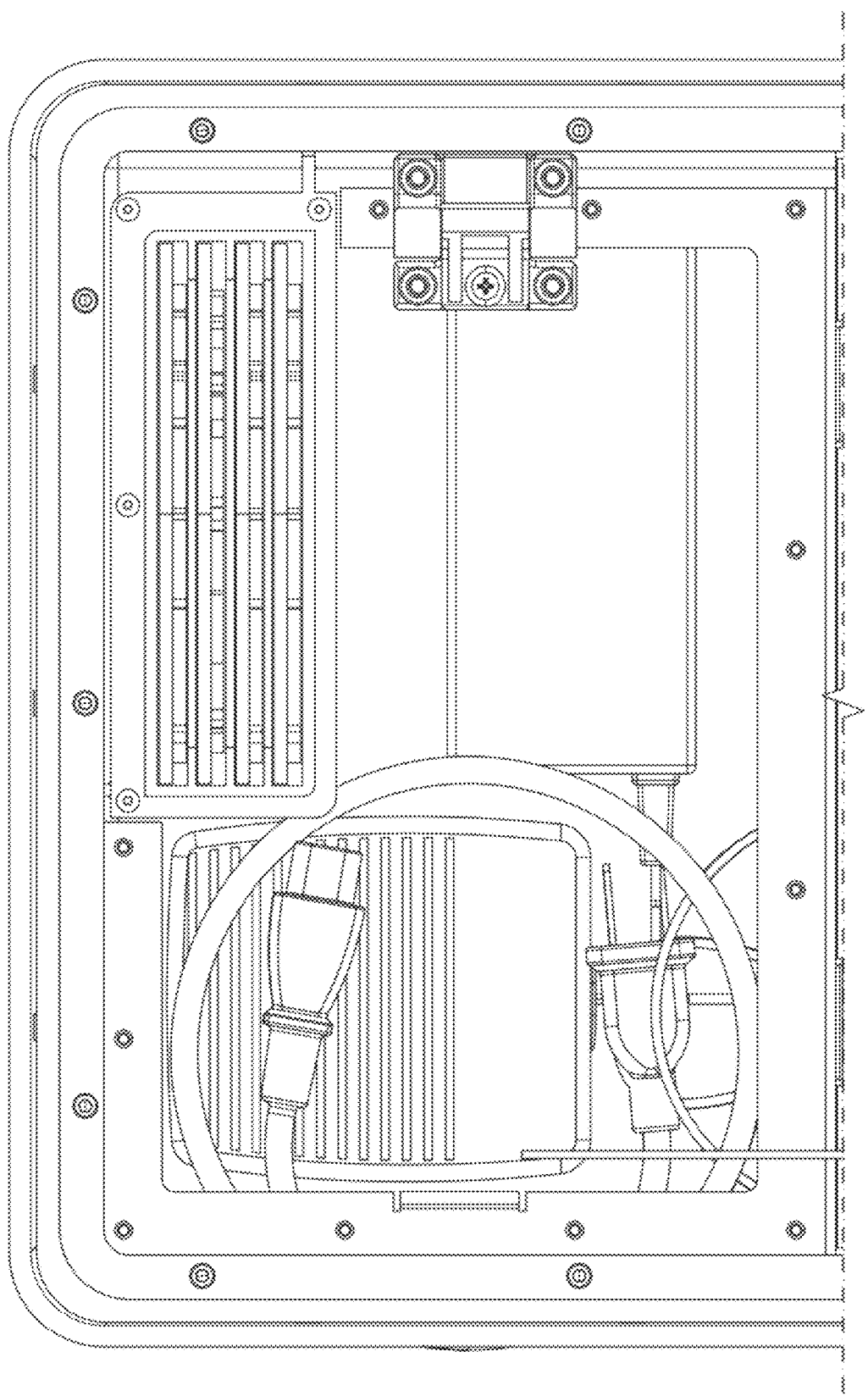
FIG. 17 depicts a close-up, top-down view of the cassette tray holder and the multi-use storage area.

In a preferred embodiment of the present invention, as shown in FIGS. 13-15, illumination of the pin-hole receptacle is accomplished using a two-axis translation stage or gantry 80, which includes a carriage 82 and one or more light sources 84 mounted onto the carriage. The gantry 80 is a conventional gantry system and also includes typical components such as motors 90 (e.g., stepper motors, screw motors or worm gears) and belts 92 (see FIGS. 13-14).

In a preferred embodiment, the light sources emit green light (e.g., at 550 nm). Light sources may be lasers, LEDs, LECs or other suitable emitters of visible electromagnetic radiation. In a preferred embodiment, the light sources comprise bright or ultra-bright LEDs, making the system safe for users' eyes as opposed to laser lights.

The present invention also comprises a process to facilitate assembly of a wire harness, including the automated wire marking identification and pin-hole receptacle illumination for insertion of corresponding wire tips or wire pins. This process of automated wire marking identification and illumination of the corresponding pin-hole receptacle is repeated until all the wires are inserted and assembly of the selected wire harness connector is completed.

The process is implemented by a computer-enabled system that stores and maintains information in a database structure on a storage drive or other non-transitory computer readable medium. The storage drive or non-transitory computer readable medium is connected to the computer, which includes at least a power source, a processor and one or more data inputs and data outputs. The information stored in the database includes one or more of wire harness IDs, harness connector IDs, cassette tray IDs, wire IDs, colors and pattern wire marking identifiers included on wire coverings, pin-hole receptacle IDs, pin-hole receptacle XY coordinates, pin-hole wire connections, user credentials and wire harness job tables, etc.

The storage drive or non-transitory computer readable medium also contains a set of process instructions that are executed by the processor to cause the system to implement the process steps of the present invention. These process steps include: prompting a user to log into the system, after which the user logs in with their user login credentials. Next, the system prompts the user to enter or select from a group of choices a wire harness ID for the wire harness that the user needs to build.

The system then registers the wire harness ID entered or selected and establishes a wire harness job table including the set of discrete tasks required to complete the wire harness assembly. A harness connector ID corresponding to the selected wire harness ID is identified. Each different wire harness connector has some number (n) of pin-hole receptacles. Some or all of those pin-hole receptacles may need to have a wire tip or wire pin inserted. In cases where not all of the pin-holes receive a wire tip or wire pin, some or all of those pin-holes may be left open or receive a stopper plug to prevent incorrect insertion of a wire tip or pin.

Next, the system identifies a cassette tray ID for a cassette tray designed to hold the designated harness connector. Harness connectors may comprise male (plugs) or female (sockets), and, for efficient space utilization, the cassette tray is equipped with one or more corresponding harness connector receptacles configured to hold a harness connector, corresponding to a selected wire harness ID.

Then, after identifying the necessary wire harness connector and the required cassette tray, the system prompts the user to retrieve the identified cassette tray and place it in a cassette tray platform located above a two-axis translation stage. Again, these components may be assembled into an independent, stand-alone insertion stage module. Following which, the system prompts the user to retrieve the identified harness connector and place it in the appropriate harness connector receptacle of the cassette tray. As described above, the various potential configurations male and female tab-slot pairings between the cassette tray receptacles and the wire harness connectors ensure that once the connector is seated in its designated receptacle, it will not experience any rotational movement.

In the process of the present invention, the system also identifies a set of (x) number of wire IDs corresponding to (x) number of wires included in the wire harness. The system also loads into the wire harness job table at least the sets of wire IDs, wire marking identifiers including one or more of colors and patterns, pin-hole receptacle IDs and pin-hole receptacle XY coordinates corresponding to the entered wire harness ID, and other data required for wire harness assembly.

Next, the processor executes a series of instructions causing the system to iterate the following steps, until all wires have been correctly inserted into their respective pin-hole receptacles in the harness connector and assembly of the wire harness is completed.

1. the system prompts the user to insert a wire into the wire marking reader
2. the system uses the wire marking reader to detect one or more color and pattern wire markings included on the wire covering such as insulation or sleeve.
3. the wire marking reader sends a data set describing the one or more colors and patterns detected as one or more computer data inputs to the wire databases.
4. the system determines a wire ID based on the one or more color and pattern markings detected.
5. the system determines the pin-hole receptacle ID and the set of pin-hole XY coordinates corresponding to the wire ID for the wire to be inserted into the pin-hole.
6. the system moves the translation stage from its present position to the position of the XY coordinates for the respective pin-hole.
7. the system switches on one or more light sources mounted to a translation stage carriage to illuminate and highlight the pin-hole from below.
8. the system prompts the user to insert the wire into the illuminated pin-hole receptacle.
9. the system prompts the user to confirm insertion of the wire into the pin-hole and upon receipt of confirmation the system marks the task of inserting the wire into its respective pin-hole receptacle as completed in the wire harness job table.
10. the system then confirms whether there are any remaining wire IDs corresponding to pin-hole receptacles that still need to have a wire inserted and, if so, the system prompts the user to insert the next wire into the wire marking reader and continues to iterate this set of instructions until all the wires are inserted and, if not, the system marks the wire harness job as completed in the wire harness job table.

The software implemented by the system may be configured to read optical character recognition fonts, such as OCR-A and OCR-B, or other fonts amenable to character recognition and machine reading. The system of the present invention only takes 5-10 seconds or even less from the time of wire insertion into the wire reader 60 to produce over 90% accuracy in identification of the wire marking. This accuracy depends in part on the wire diameter, as well as other relevant factors such as color, contrast, reflectivity, software training, etc.

The claimed invention may be expressed in alternative arrangements while still maintaining the spirit of its original purpose and fundamental features. The described embodiments explain but do not limit the invention to the selected exemplary embodiments. Details concerning the invention are covered in the appended claims rather than the previous description. Additional information in the claims concerning the present invention are to be realized to the extent of their own capacity.

Various modifications and variations of the described invention will be apparent to those skilled in the art without departing from the scope and spirit of the invention. Although the disclosure has been described in connection with specific preferred embodiments, it should be understood that the invention as claimed should not be unduly limited to such specific embodiments. Indeed, those skilled in the art will recognize, or be able to ascertain using no more than routine experimentation, many equivalents to the specific embodiments of the invention described herein. Such equivalents are intended to be encompassed by the following claims.

What is claimed is:

1. A system configured to facilitate assembly and fabrication of a wire or cable harness or bundle, including identification of one or more wires and cables for inclusion in a respective harness or bundle, comprising:
   one or more computers, including one or more computer memories comprising non-transitory computer-readable media, one or more computer processors, and one or more displays, each of the foregoing electronically connected to and in data communication with each other and having one or more data inputs and one or more data outputs enabling the data communication;

a marking reader, including one or more reader light sources configured to illuminate the one or more wires and cables and one or more sensors configured to detect one or more of color and pattern markings present on the one or more wires and cables, wherein the marking reader includes data input and data output connections to the one or more computers, wherein the marking reader is configured to hold the one or more wires and cables within a telecentric configuration, whereby a magnification of an image of the one or more wires and cables is made independent of a distance from the one or more wires and cables to the one or more sensors, and wherein the one or more computers are configured to identify the one or more wires and cables based on the one or more color and pattern markings detected by the one or more sensors;

one or more harness connectors having one or more pin-hole receptacles configured to receive and connect to the one or more wires and cables required to build the wire or cable harness or bundle, wherein the one or more computers are configured to identify each pinhole receptacle of the one or more harness connectors included in a sequence of wire or cable pin-hole insertions required to assemble the wire or cable harness or bundle, based on the wire or cable identified by the one or more computers, as an indication of a wire or cable insertion required for a selected pin-hole receptacle; and one or more pin-hole illuminating light sources configured to illuminate the one or more pin-hole receptacles identified as requiring a wire or cable pin-hole insertion to assemble the wire or cable harness or bundle.

2. The system of claim 1, wherein the pattern is one or more of a striping pattern, a bar code, a QR code, a geometric pattern and one or more alphanumeric characters.

3. The system of claim 1, wherein the system further includes one or more of a touch screen, keyboard, a microphone, voice command, a mouse, a foot pedal, and an image capture button, configured to trigger the marking reader to capture an image of a wire or cable covering, including the one or more color and pattern markings.

4. The system of claim 1, wherein the marking reader is equipped with a set of adjusting wire grippers configured to hold the wires or cables in place.

5. The system of claim 4, wherein the set of adjustable wire grippers hold the wires or cables in place at a location comprising a center point between or within the one or more sensors of the marking reader.

6. The system of claim 1, wherein the system further includes a database structure configured to store information and contained within the one or more non-transitory computer readable media, wherein the information includes one or more of harness IDs, harness connector IDs, wire or cable IDs, color and pattern marking identifiers included on wire or cable coverings, pin-hole receptacle IDs, wire or cable pin-hole connections, user credentials and harness job tables, and wherein the non-transitory computer readable medium also contains a set of process instructions, which, when executed by the one or more processors, cause the system to prompt a user to provide and collect information related to at least a harness job table stored in the database structure, including one or more of 1) a harness ID for a wire harness, wire bundle, or cable harness, 2) a harness connector ID corresponding to the selected harness ID, wherein the harness connector includes a plurality of pin-hole receptacles configured to receive one or more wires or cables, or wire or cable tips, 3) a list of wire or cable marking identifiers including the one or more color and pattern markings for each respective wire or cable identified in the list of wire or cables associated with the harness job table, and 4) a list of discrete tasks required to complete the harness, wherein the marking reader creates and sends one or more data sets describing the one or more color and pattern markings detected to the computer via the computer data input.

7. A process to facilitate assembly and fabrication of a wire or cable harness or bundle, including identification of one or more wires and cables for inclusion in a fabrication assembly process for a respective harness or bundle, implemented by a computer-enabled system and comprising the steps of:

storing and maintaining information in a database structure on a non-transitory computer readable medium,
wherein the non-transitory computer readable medium is connected to a computer that includes at least a power source, a processor and one or more data inputs and data outputs,
wherein the information includes one or more of harness IDs, harness connector IDs, wire or cable IDs, colors and pattern marking identifiers included on wire or cable coverings, pin-hole receptacle IDs, wire or cable pin-hole connections, user credentials and harness job tables, and
wherein the non-transitory computer readable medium also contains a set of process instructions;

executing by the processor the set of process instructions stored on the non-transitory computer readable medium, causing the system to implement one or more of the following steps:

prompting a user to log in to the system, using the user credentials;

prompting the user to enter a harness ID for a wire harness, wire bundle, or cable harness the user needs to build, registering the entered harness ID, establishing a harness job table including the set of discrete tasks required to complete the harness;

identifying a harness connector ID corresponding to the selected harness ID, wherein the harness connector has (n) number of pin-hole receptacles;

identifying a harness connector ID, each harness connector configured to receive one or more wires or cables, or wire or cable tips, a harness connector corresponding to the selected harness connector ID;

prompting the user to retrieve the identified harness connector;

identifying a set of (x) number of wire or cable IDs corresponding to (x) number of wires or cables included in the harness and loading into the harness job table at least the set of wire or cable IDs, a set of marking identifiers including one or more of color and pattern markings, and a set of pin-hole receptacle IDs corresponding to the entered harness ID;

iterating one or more instructions in the following instruction set until all wires or cables have been correctly inserted into their respective pin-hole receptacles in the harness connector:

prompting the user to insert a wire or cable into a marking reader having data input and data output connections to the computer, wherein the marking reader implements a telecentric configuration whereby the magnification of an image of the wire or cable is made independent of the distance from the wire or cable to the one or more sensors of the marking reader;

detecting by the marking reader, one or more of a color and a pattern marking included on a wire or cable covering inserted into the marking reader;

sending from the marking reader to one or more computer data inputs a data set describing the one or more colors and pattern markings detected;

determining a wire or cable ID based on one or more of the colors and pattern markings detected;

determining the pin-hole receptacle ID corresponding to the wire or cable ID for the wire or cable that will be inserted into the respective pin-hole receptacle;

prompting the user to insert the wire or cable into a respective illuminated pin-hole receptacle;

marking the task of inserting the wire or cable into its respective pin-hole receptacle as completed in the harness job table upon receiving from the user an indication that the task of inserting the wire or cable has been completed;

confirming whether there are any remaining wire or cable IDs corresponding to pin-hole receptacles that still need to have a wire or cable inserted and, if so, prompting the user to insert another wire or cable into the marking reader and continuing to iterate this set of instructions until all the wires and cables are inserted, and, if not, marking the harness job as completed in the harness job table.

8. The process of claim 7, wherein the information stored and maintained in the database structure on the non-transitory computer readable medium further includes pin-hole receptacle IDs for all pin-hole connections that need to be blocked by a stopper and the set of process instructions stored on the non-transitory computer readable medium for execution by the processor cause the system to further iterate one or more steps included in the following instruction set until all stoppers have been correctly inserted into their respective blocked pin-hole receptacles in the harness connector:

identifying one or more pin-hole receptacle IDs corresponding to up to (n-x) number of blocked pin-hole receptacles determined by the selected harness ID, where 'n' is the total number of pin-hole cavities included in the connector and 'x' is the number of wires or cables required for the selected harness connector;

determining the pin-hole receptacle ID for a blocked pin-hole receptacle;

prompting the user to insert the stopper into a respective illuminated pin-hole receptacle;

marking the task of inserting the stopper into its respective pin-hole receptacle as completed in the harness job table upon receiving from the user an indication that the task of inserting the stopper has been completed;

confirming whether there are any remaining pin-hole receptacle IDs corresponding to pin-hole receptacles that still need to have the stopper inserted and, if so, continuing to iterate this set of instructions and, if not, marking the task of blocking the blocked pin-hole receptacles as completed in the harness job table.

9. The process of claim 7, wherein the process further includes the steps of confirming whether the wire or cable ID of the wire or cable inserted into the marking reader corresponds to a wire or cable ID included in the harness job table, and if the wire or cable ID cannot be determined based on the harness job table, indicating the wire or cable as non-compliant for the present harness job and searching a global database for the wire or cable ID.

10. The process of claim 7, wherein the process further includes the steps of:

prompting the user to insert the wire or cable into the respective pin-hole receptacle and to confirm when insertion is complete;

determining whether insertion of the wire or cable into the respective pin-hole receptacle has been completed using a sensor to determine if the wire or cable, or wire or cable tip, respectively, has been inserted into the designated pin-hole receptacle.

11. The process of claim 7, and wherein the pattern marking comprises one or more of a striping pattern, a bar code, a QR code, a geometric pattern and one or more alphanumeric characters.

12. The process of claim 7, wherein the marking reader is equipped with a set of adjusting wire grippers configured to hold the wires or cables in place.

13. The process of claim 12, wherein the set of adjusting wire grippers hold the wires or cables in place at a location comprising a center point between or within the one or more sensors of the marking reader.

14. The process of claim 7, wherein the database structure is configured to store information within the one or more non-transitory computer readable media, wherein the information includes one or more of harness IDs, harness connector IDs, wire or cable IDs, color and pattern marking identifiers included on wire or cable coverings, pin-hole receptacle IDs, wire or cable pin-hole connections, user credentials and harness job tables, and wherein the non-transitory computer readable medium also contains a set of process instructions, which, when executed by the one or more processors, cause the system to prompt a user to provide and collect information related to at least a harness job table stored in the database structure, including one or more of 1) a harness ID for a wire harness, wire bundle, or cable harness, 2) a harness connector ID corresponding to the selected harness ID, wherein the harness connector includes a plurality of pin-hole receptacles configured to receive one or more wires or cables, or wire or cable tips, 3) a list of wire or cable marking identifiers including the one or more color and pattern markings for each respective wire or cable identified in the list of wire or cables associated with the harness job table, and 4) a list of discrete tasks required to complete the harness, wherein the marking reader creates and sends one or more data sets describing the one or more color and pattern markings detected to the computer via the computer data input.

15. A computer operated device configured to facilitate assembly and fabrication of a wire or cable harness or bundle, including insertion of wires and cables into respective assigned pin-hole receptacles of a respective harness or bundle connector, comprising:

one or more computers, including one or more computer memories, comprising non-transitory computer-readable media, one or more computer processors, and one or more displays, with each of the foregoing electrically connected to and in data communication with each other and having one or more data inputs and one or more data outputs enabling the data communication, a marking reader, including one or more reader light sources configured to illuminate the one or more wires and cables and one or more sensors configured to detect one or more of color and pattern markings present on the one or more wires and cables, wherein the marking reader includes data input and data output connections to the one or more computers, wherein the marking reader is configured to hold the one or more wires and cables within a telecentric configuration, whereby a magnification of an image of the one or more wires and cables is made independent of a distance from the one or more wires and cables to the one or more sensors, and wherein the one or more computers are configured to identify the one or more wires and cables based on the one or more color and pattern markings detected by the one or more sensors;

one or more harness connectors having one or more pin-hole receptacles configured to receive and connect to the one or more wires and cables required to build the wire or cable harness or bundle, wherein the one or more computers are configured to identify each pinhole receptacle of the one or more harness connectors included in a sequence of wire or cable pin-hole insertions required to assemble the wire or cable harness or bundle, based on the wire or cable identified by the one or more computers, as an indication of a wire or cable insertion required for a selected pin-hole receptacle; and one or more pin-hole illuminating light sources configured to illuminate the one or more pin-hole receptacles identified as requiring a wire or cable pin-hole insertion to assemble the wire or cable harness or bundle.

16. The computer operated device of claim 15, wherein the system further includes one or more of a touch screen, keyboard, a microphone, voice command, a mouse, a foot pedal, and an image capture button, configured to trigger the marking reader to capture an image of a wire or cable covering, including the one or more color and pattern markings.

17. The computer operated device of claim 15, and wherein the pattern marking comprises one or more of a striping pattern, a bar code, a QR code, a geometric pattern and one or more alphanumeric characters.

18. The computer operated device of claim 15, wherein the marking reader is equipped with a set of adjusting wire grippers configured to hold wires or cables in place.

19. The computer operated device of claim 18, wherein the set of adjusting wire grippers hold the wires or cables in place at a location comprising a center point between or within the one or more sensors of the marking reader.

20. The computer operated device of claim 15, wherein the system further includes a database structure configured to store information and contained within the one or more non-transitory computer readable media, wherein the information includes one or more of harness IDs, harness connector IDs, wire or cable IDs, color and pattern marking identifiers included on wire or cable coverings, pin-hole receptacle IDs, wire or cable pin-hole connections, user credentials and harness job tables, and wherein the non-transitory computer readable medium also contains a set of process instructions, which, when executed by the one or more processors, cause the system to prompt a user to provide and collect information related to at least a harness job table stored in the database structure, including one or more of 1) a harness ID for a wire harness, wire bundle, or cable harness, 2) a harness connector ID corresponding to the selected harness ID, wherein the harness connector includes a plurality of pin-hole receptacles configured to receive one or more wires or cables, or wire or cable tips, 3) a list of wire or cable marking identifiers including the one or more color and pattern markings for each respective wire or cable identified in the list of wire or cables associated with the harness job table, and 4) a list of discrete tasks required to complete the harness, wherein the marking reader creates and sends one or more data sets describing the one or more color and pattern markings detected to the computer via the computer data input.

* * * * *

UNITED STATES PATENT AND TRADEMARK OFFICE
CERTIFICATE OF CORRECTION

PATENT NO.        : 12,288,630 B2
APPLICATION NO.   : 18/951219
DATED             : April 29, 2025
INVENTOR(S)       : Yogesh Mehrotra and Paul Glenn Page 1 of 1

It is certified that error appears in the above-identified patent and that said Letters Patent is hereby corrected as shown below:

On the Title Page

Item (71) Applicant and item (73) Assignee should read as 'Materials Technologies Corporation'.

Signed and Sealed this
Second Day of September, 2025

Coke Morgan Stewart
*Acting Director of the United States Patent and Trademark Office*